(12) United States Patent
Binkley et al.

(10) Patent No.: US 8,963,341 B2
(45) Date of Patent: Feb. 24, 2015

(54) PROCESS FOR PLACING, SECURING AND INTERCONNECTING ELECTRONIC COMPONENTS

(76) Inventors: Edward Binkley, Los Altos, CA (US); Robert Cattaneo, San Jose, CA (US); Hiep Nghi, San Jose, CA (US); George Laurie, Fremont, CA (US); Richard Otte, Los Altos Hills, CA (US)

( * ) Notice: Subject to any disclaimer, the term of this patent is extended or adjusted under 35 U.S.C. 154(b) by 491 days.

(21) Appl. No.: 12/734,055

(22) PCT Filed: Oct. 14, 2008

(86) PCT No.: PCT/US2008/011693
§ 371 (c)(1),
(2), (4) Date: Apr. 7, 2010

(87) PCT Pub. No.: WO2009/051679
PCT Pub. Date: Apr. 23, 2009

(65) Prior Publication Data
US 2010/0206462 A1 Aug. 19, 2010

Related U.S. Application Data

(60) Provisional application No. 60/960,823, filed on Oct. 16, 2007, provisional application No. 61/006,571, filed on Jan. 22, 2008.

(51) Int. Cl.
*H01L 23/48* (2006.01)

(52) U.S. Cl.
USPC ............... 257/780; 257/774; 264/272.17

(58) Field of Classification Search
None
See application file for complete search history.

(56) References Cited

U.S. PATENT DOCUMENTS

| | | | | |
|---|---|---|---|---|
| 4,635,356 A | * | 1/1987 | Ohuchi et al. | 29/841 |
| 5,200,362 A | * | 4/1993 | Lin et al. | 29/841 |
| 5,273,938 A | * | 12/1993 | Lin et al. | 438/107 |
| 5,300,459 A | * | 4/1994 | Ushikubo et al. | 438/126 |
| 5,928,598 A | * | 7/1999 | Anderson et al. | 264/446 |
| 2006/0043606 A1 | * | 3/2006 | Imaoka et al. | 257/780 |

FOREIGN PATENT DOCUMENTS

DE   10 2005 003 125 A1   7/2006
FR   2 818 804 A1   6/2002

* cited by examiner

*Primary Examiner* — Edmund H. Lee

(57) ABSTRACT

A method for fabricating an electronic assembly which enables the assembly and interconnection of surface mount components and/or other electrical, electronic, electro-optical, electro-mechanical and user interface devices with external I/O contacts on a planar surface without the use of solder or otherwise exposing the components to temperatures substantially above ambient.

12 Claims, 21 Drawing Sheets

First embodiment of the assembly process.

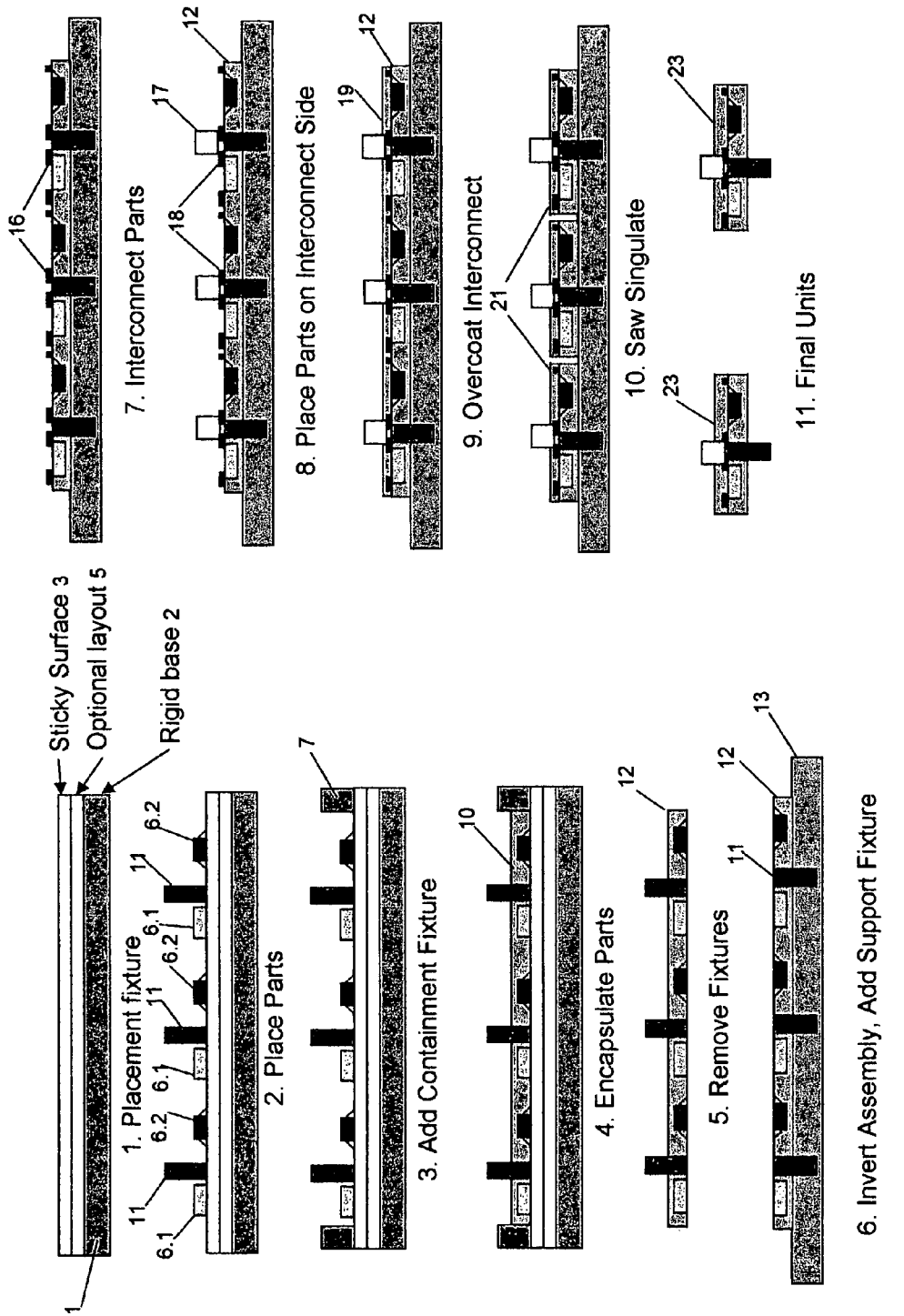
Figure 1. First embodiment of the assembly process.

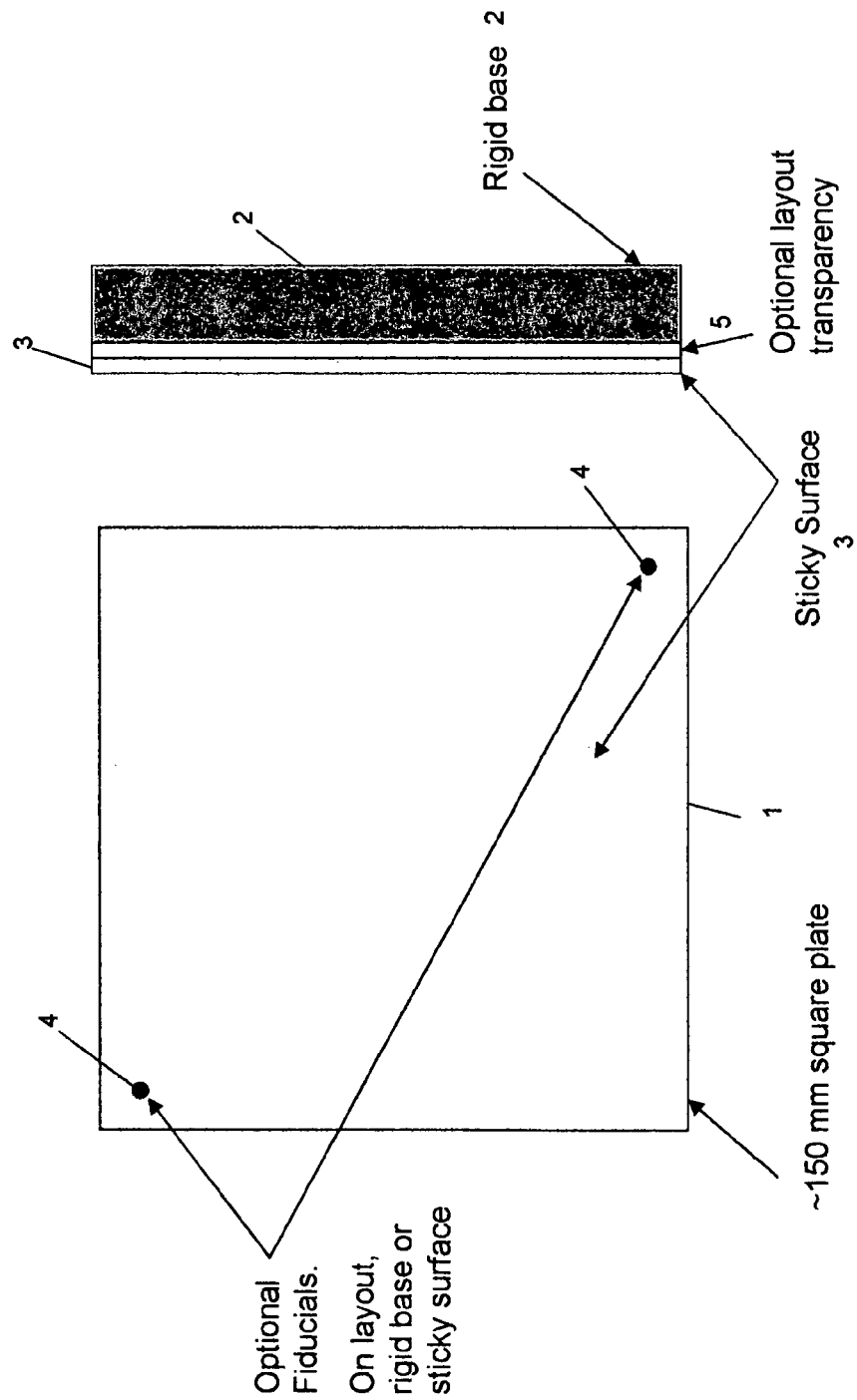
Figure 2. Placement fixture.

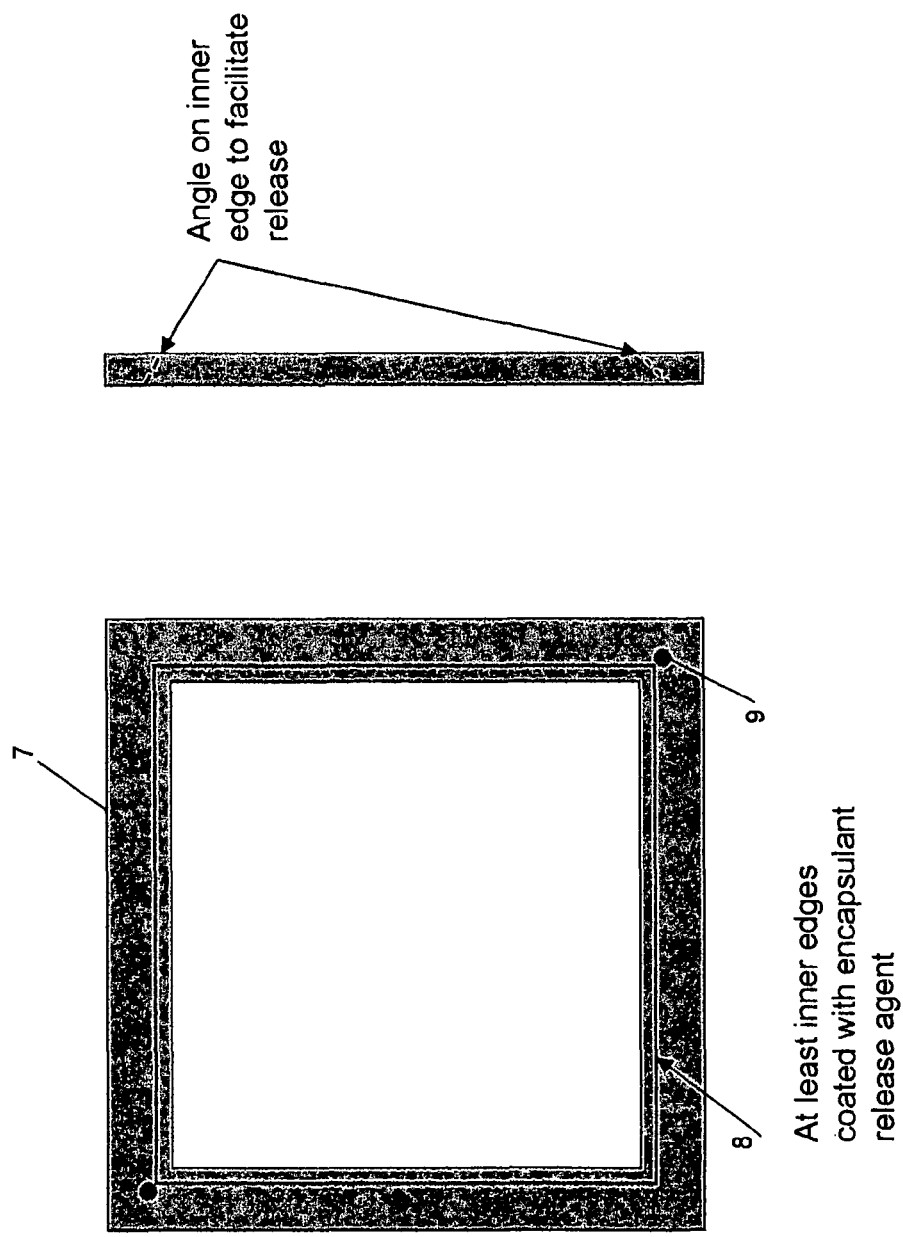
Figure 3. Containment fixture

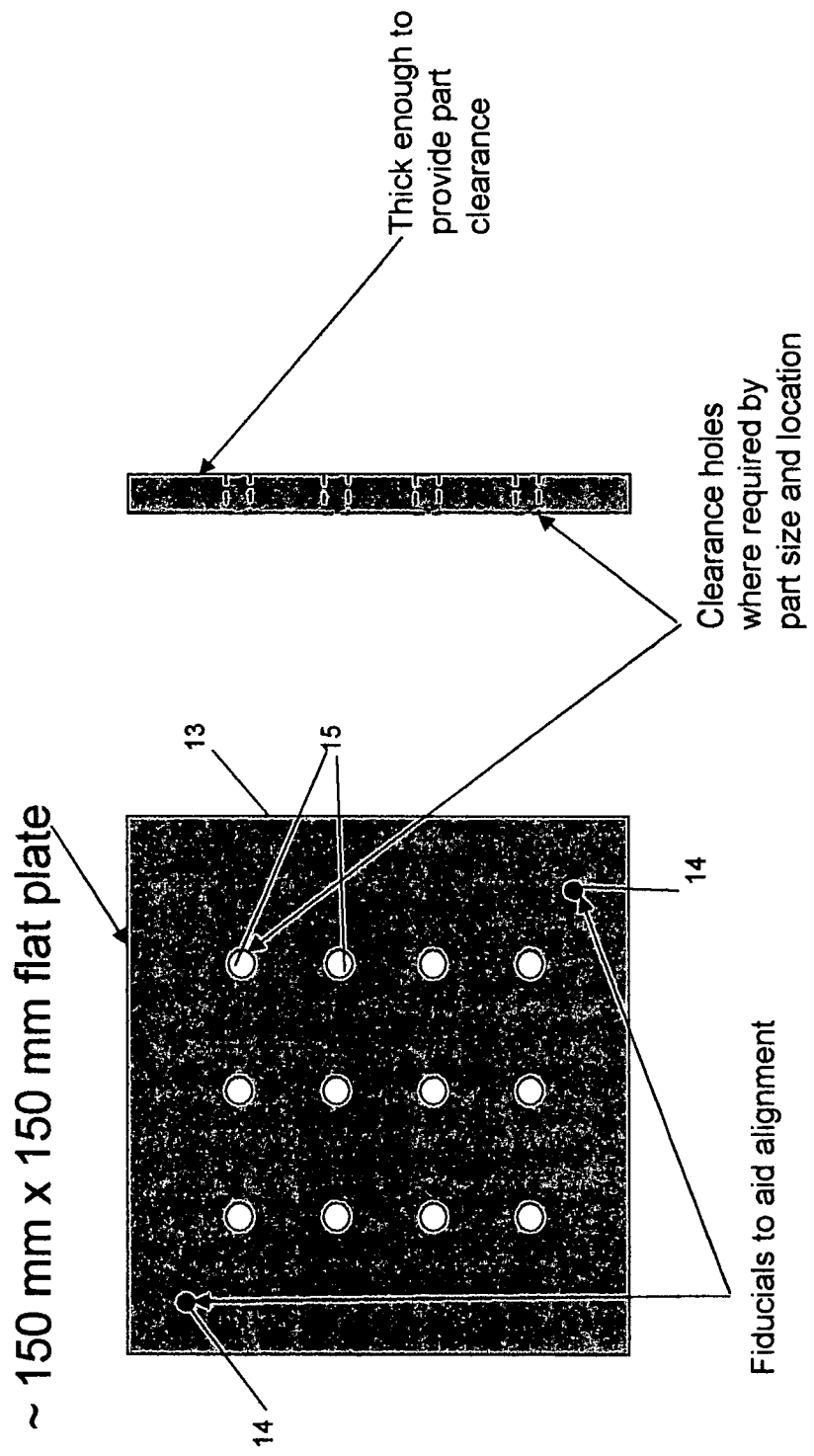
Figure 4. Support fixture

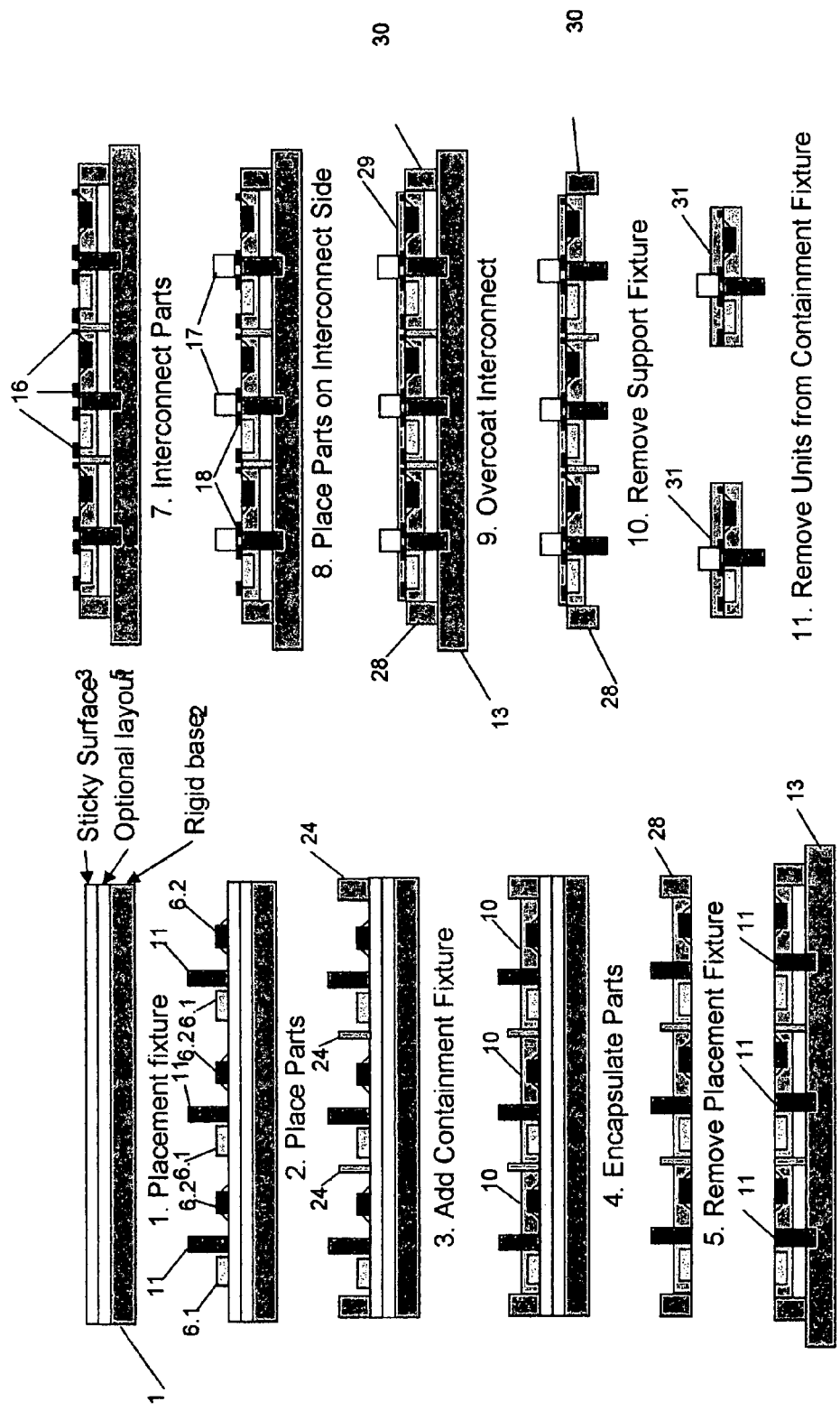

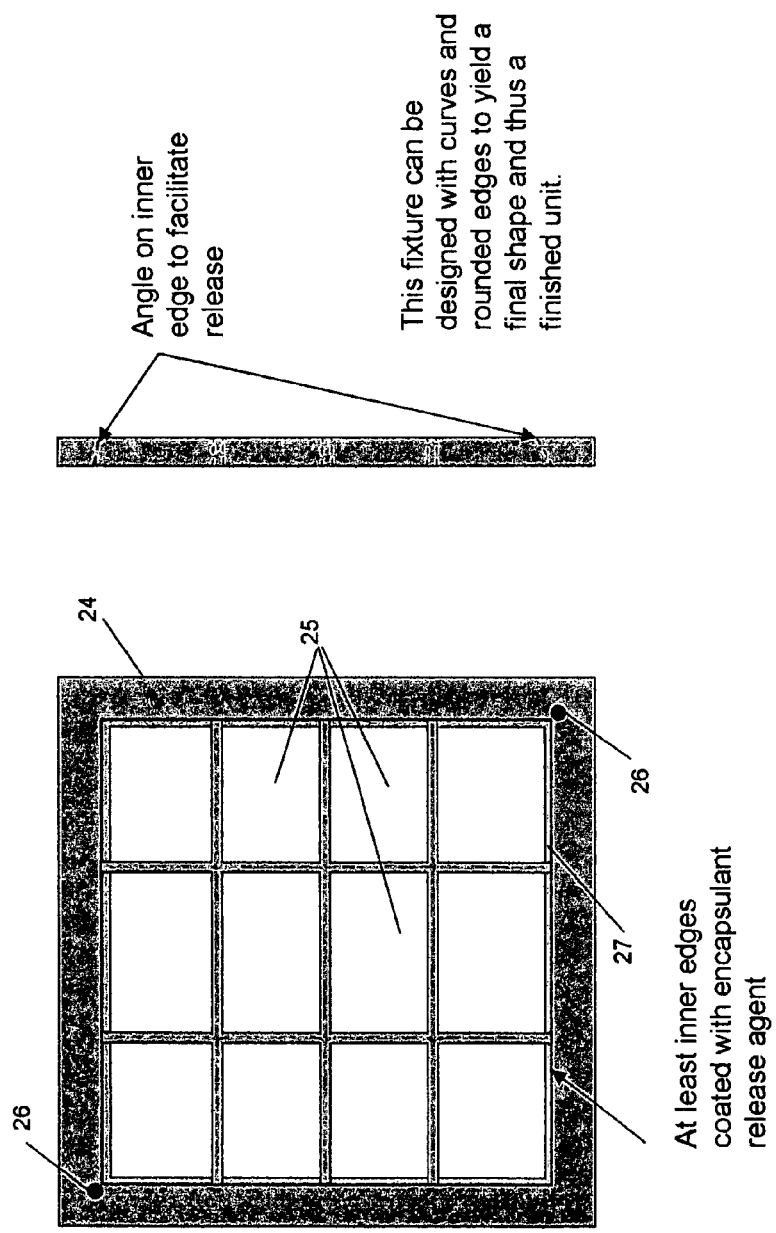
Figure 6. Containment fixture for individually encapsulated final units using the second embodiment of the assembly procedure shown in Figure 5.

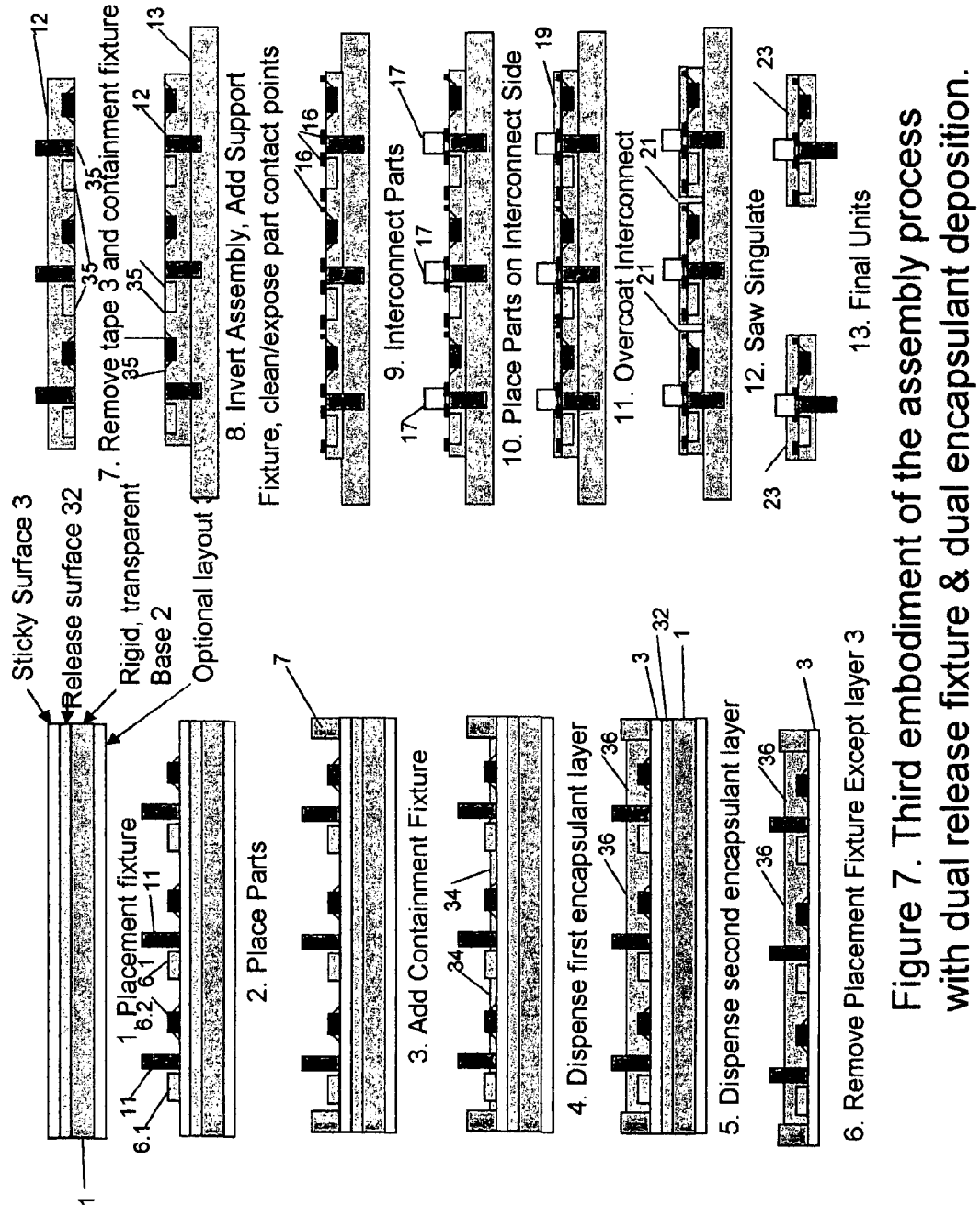
Figure 7. Third embodiment of the assembly process with dual release fixture & dual encapsulant deposition.

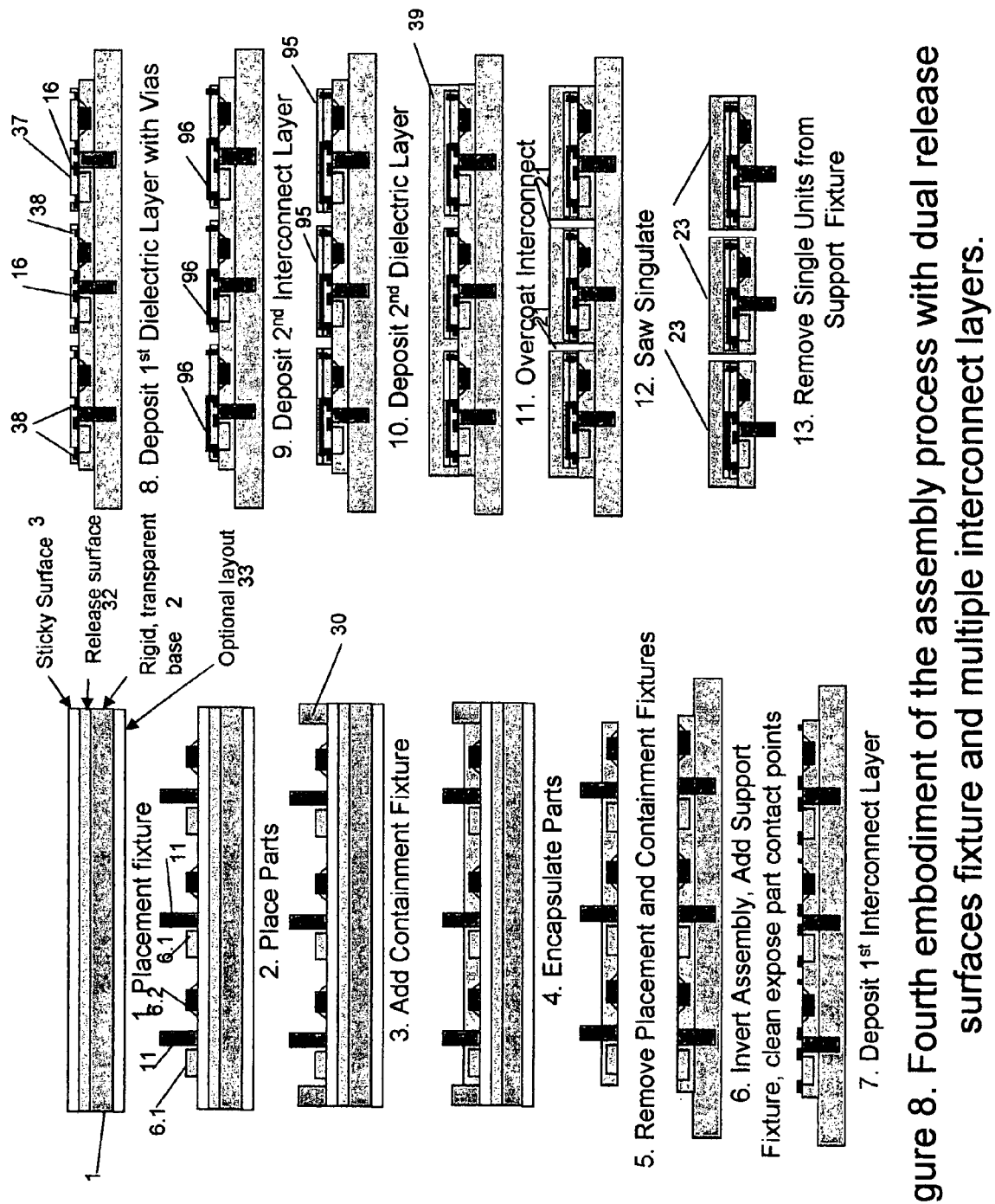
Figure 8. Fourth embodiment of the assembly process with dual release surfaces fixture and multiple interconnect layers.

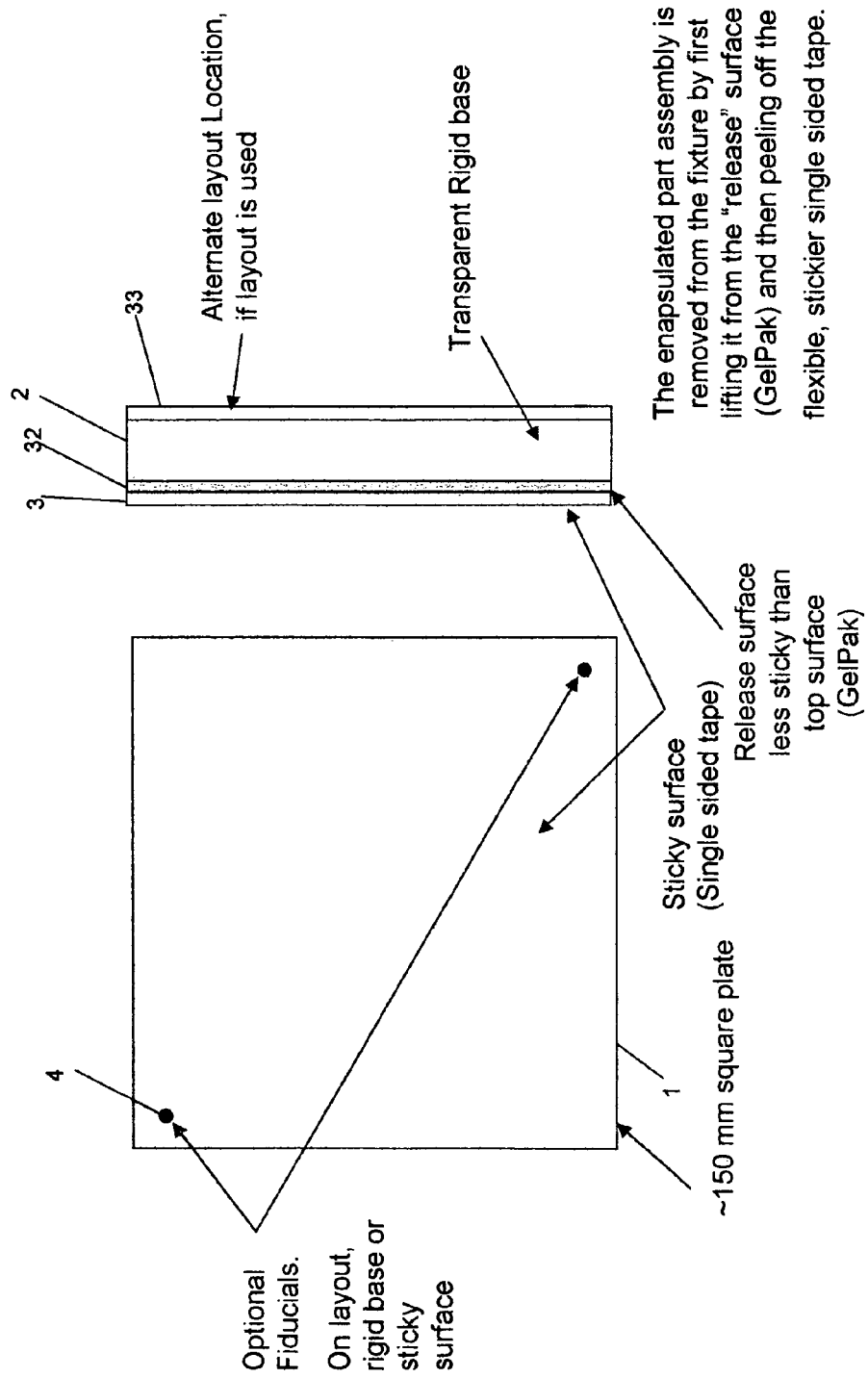
Figure 9. Variation of Placement Fixture of Figure 2 with dual release surfaces.

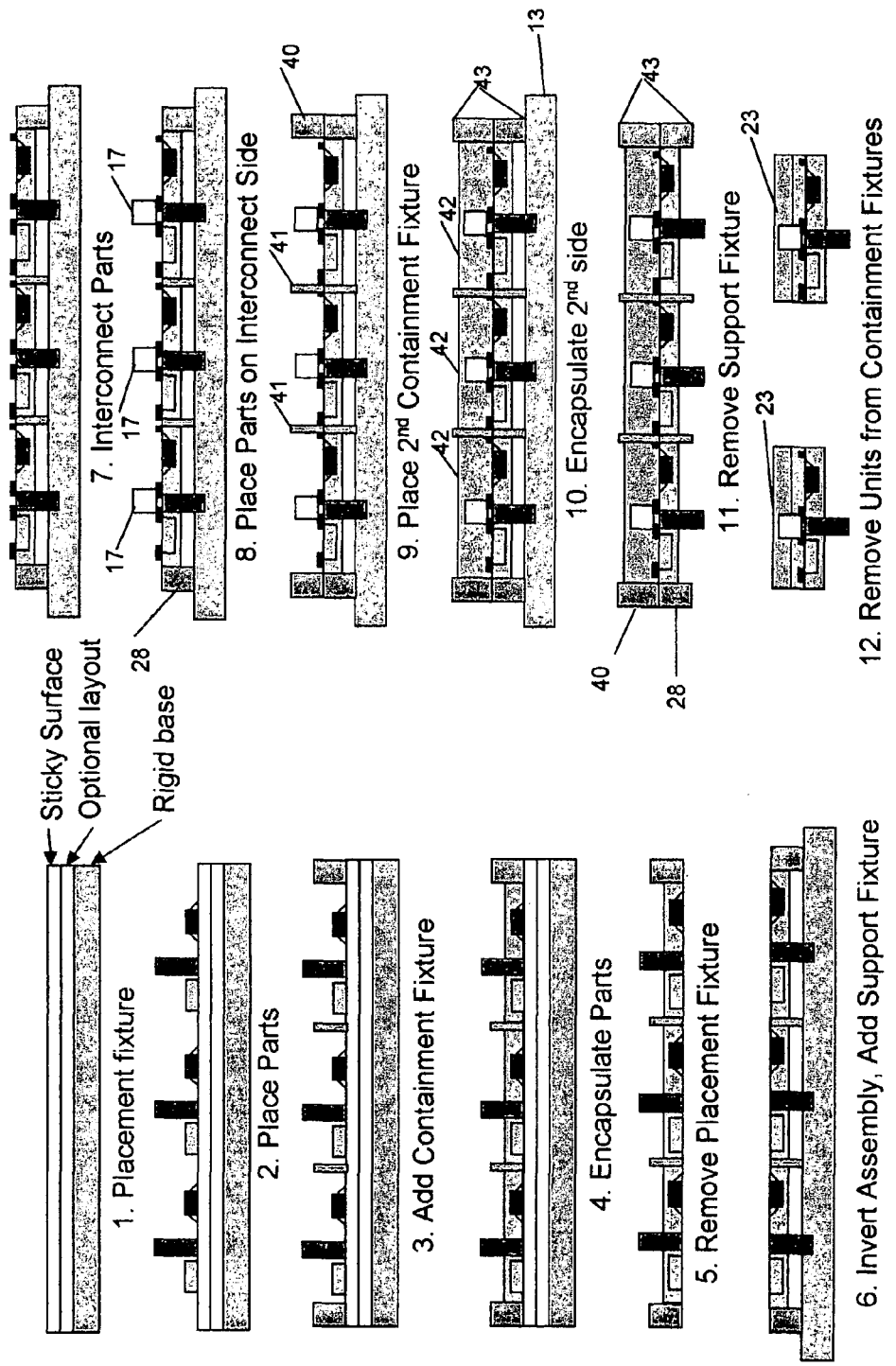
Figure 10. Fifth embodiment of the assembly process with a second side encapsulation fixture.

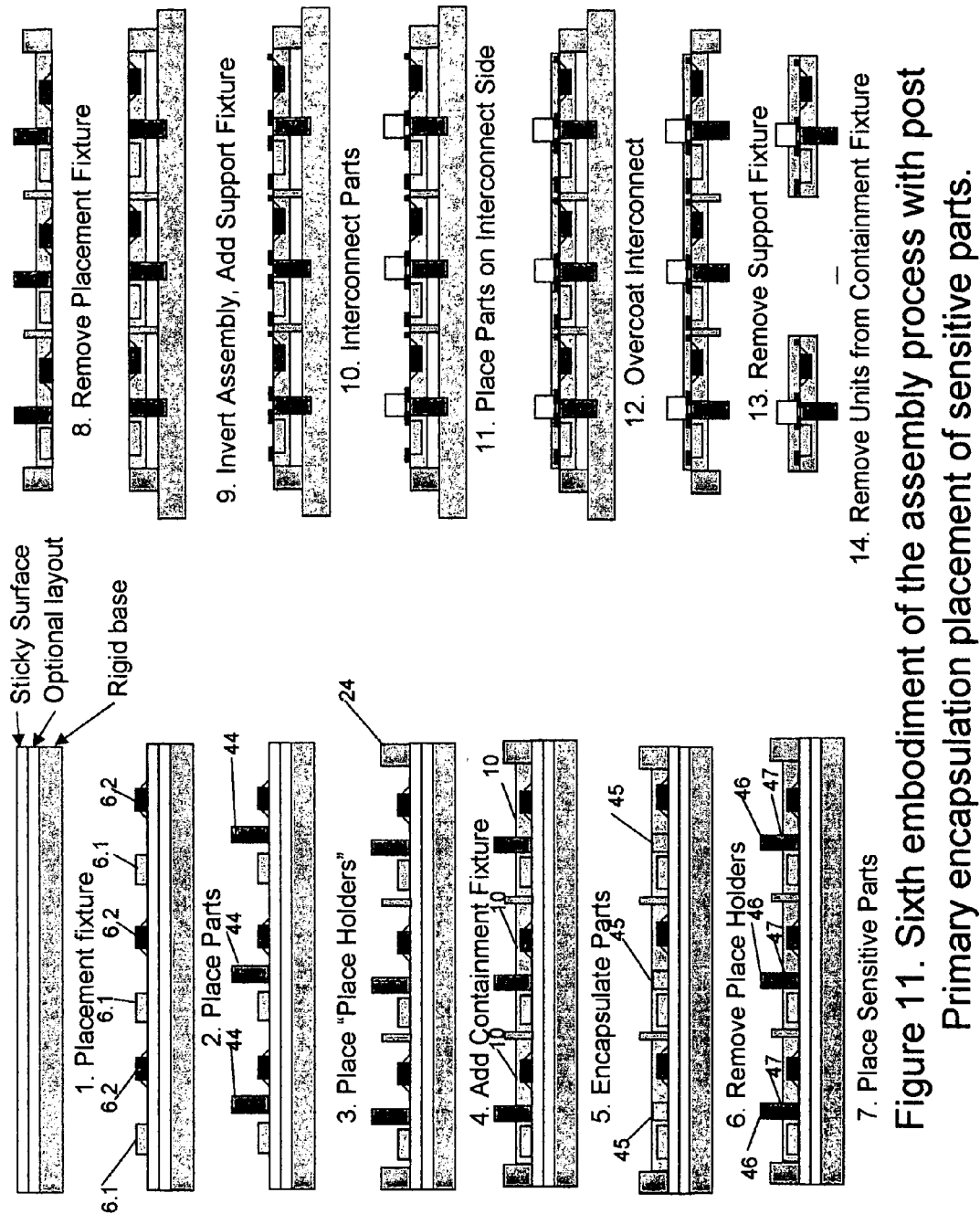
Figure 11. Sixth embodiment of the assembly process with post Primary encapsulation placement of sensitive parts.

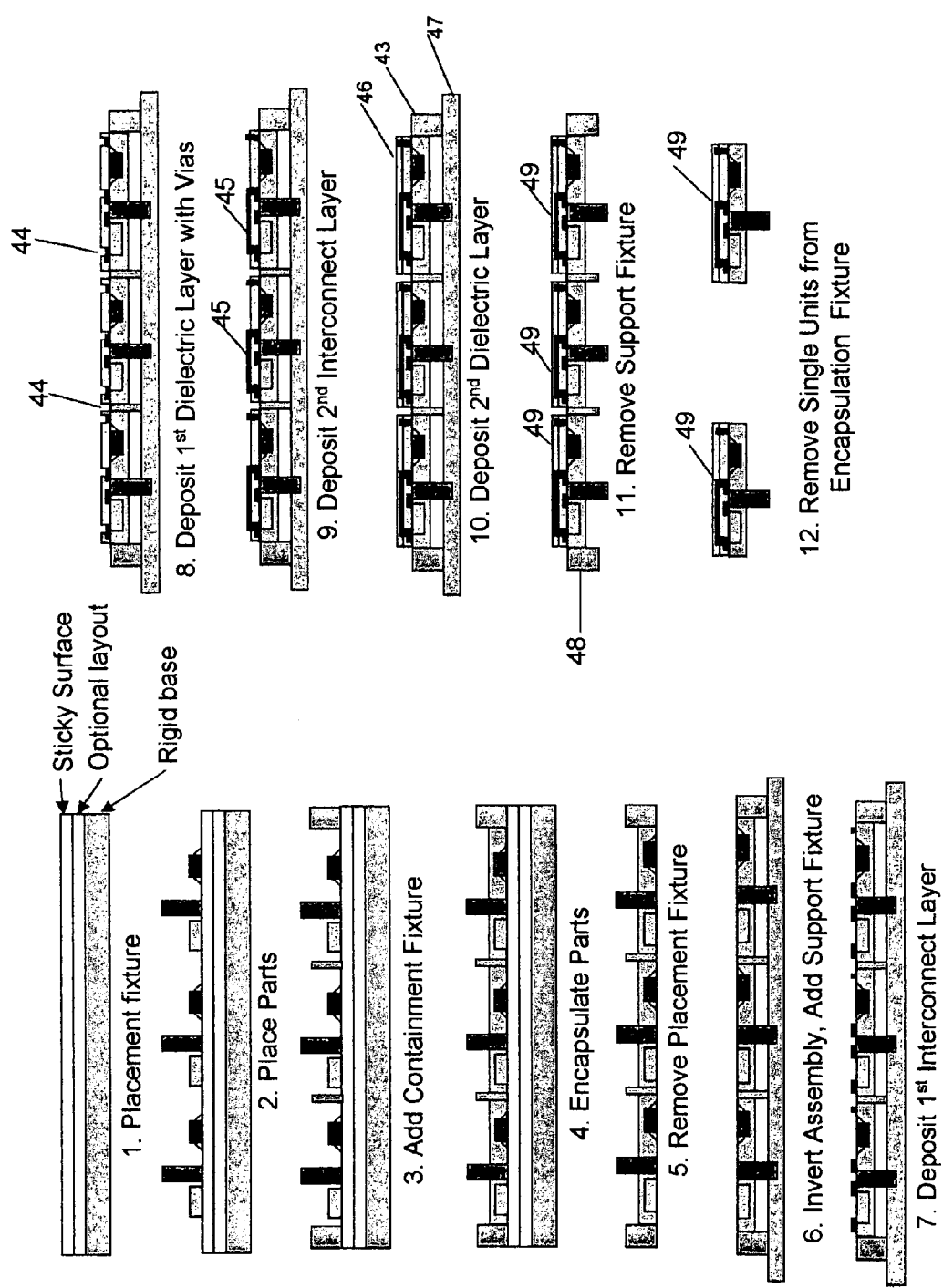
Figure 12. Seventh embodiment of the assembly process with dielectric separation.

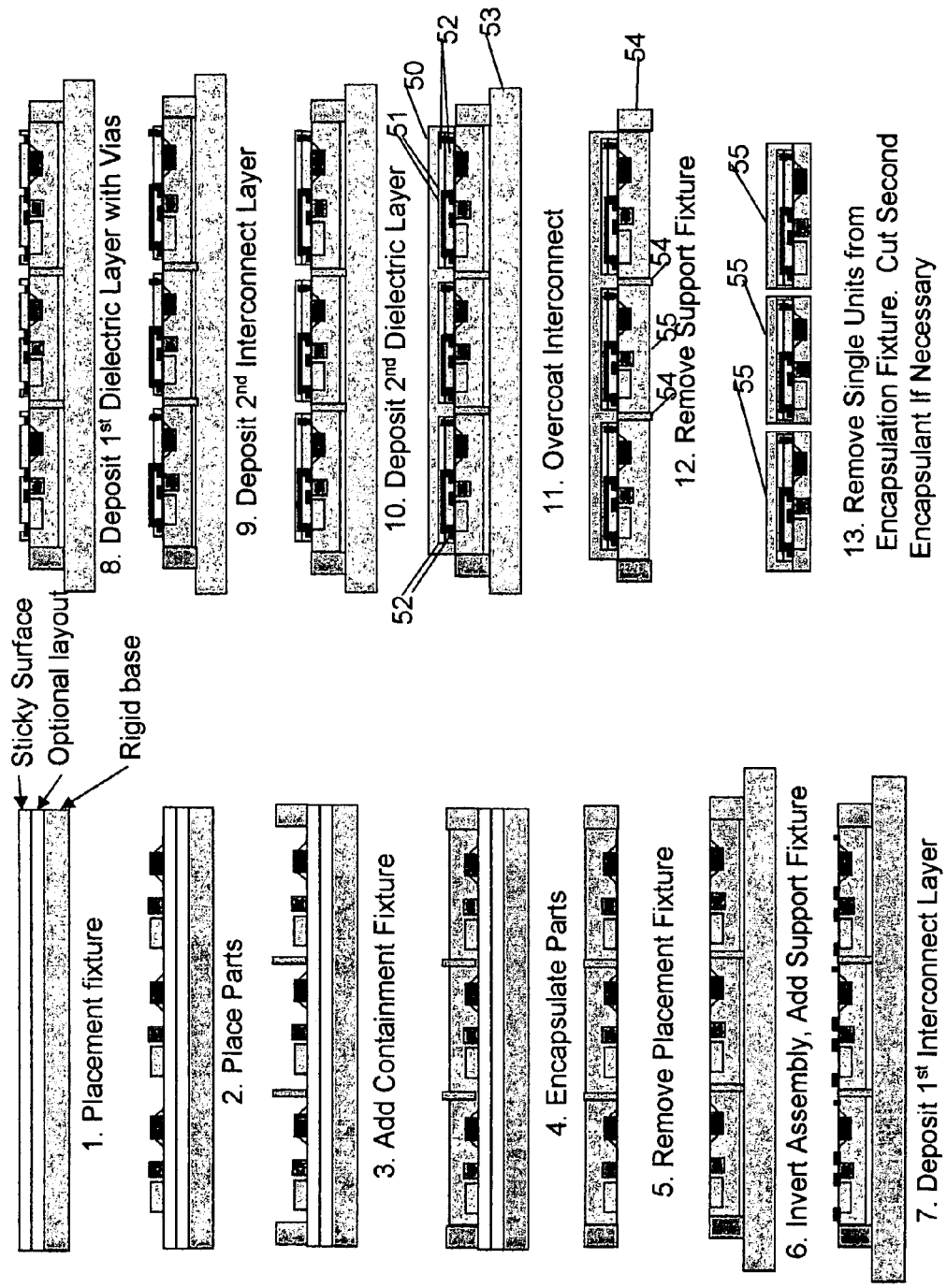
Figure 13. Eighth embodiment of the assembly process with thin interconnect overcoat.

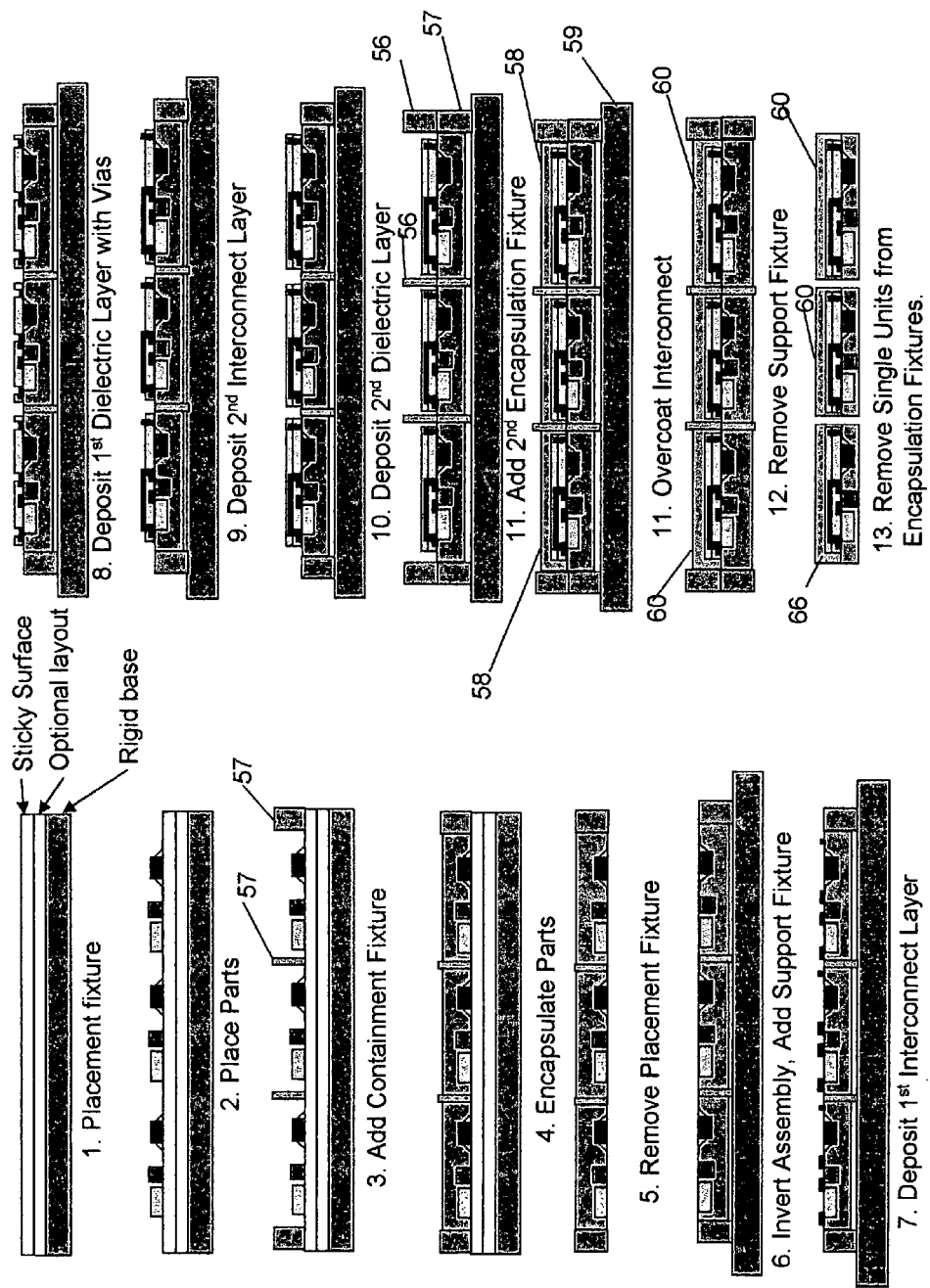
Figure 14. Ninth embodiment of the assembly process with 2nd side encapsulation.

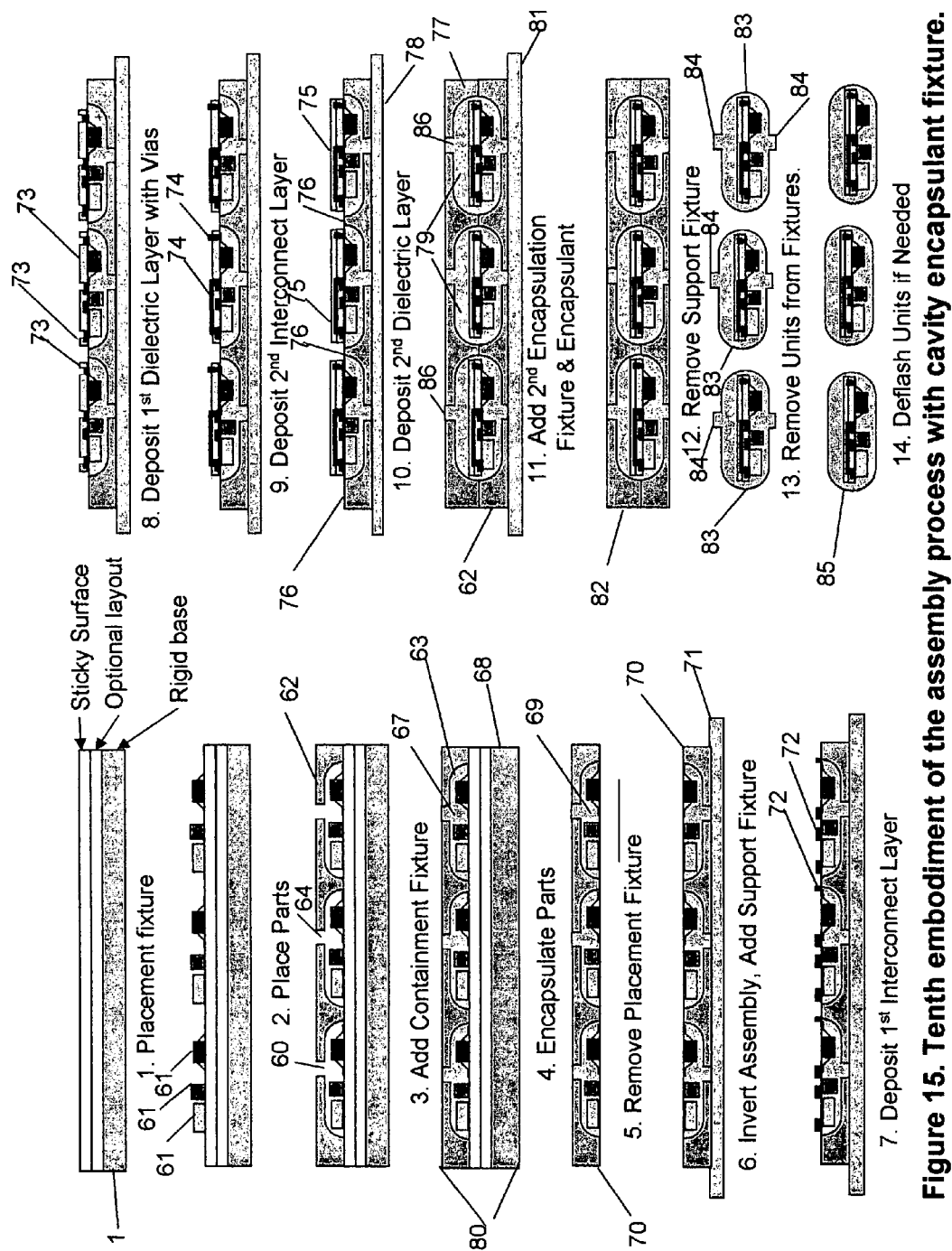
Figure 15. Tenth embodiment of the assembly process with cavity encapsulant fixture.

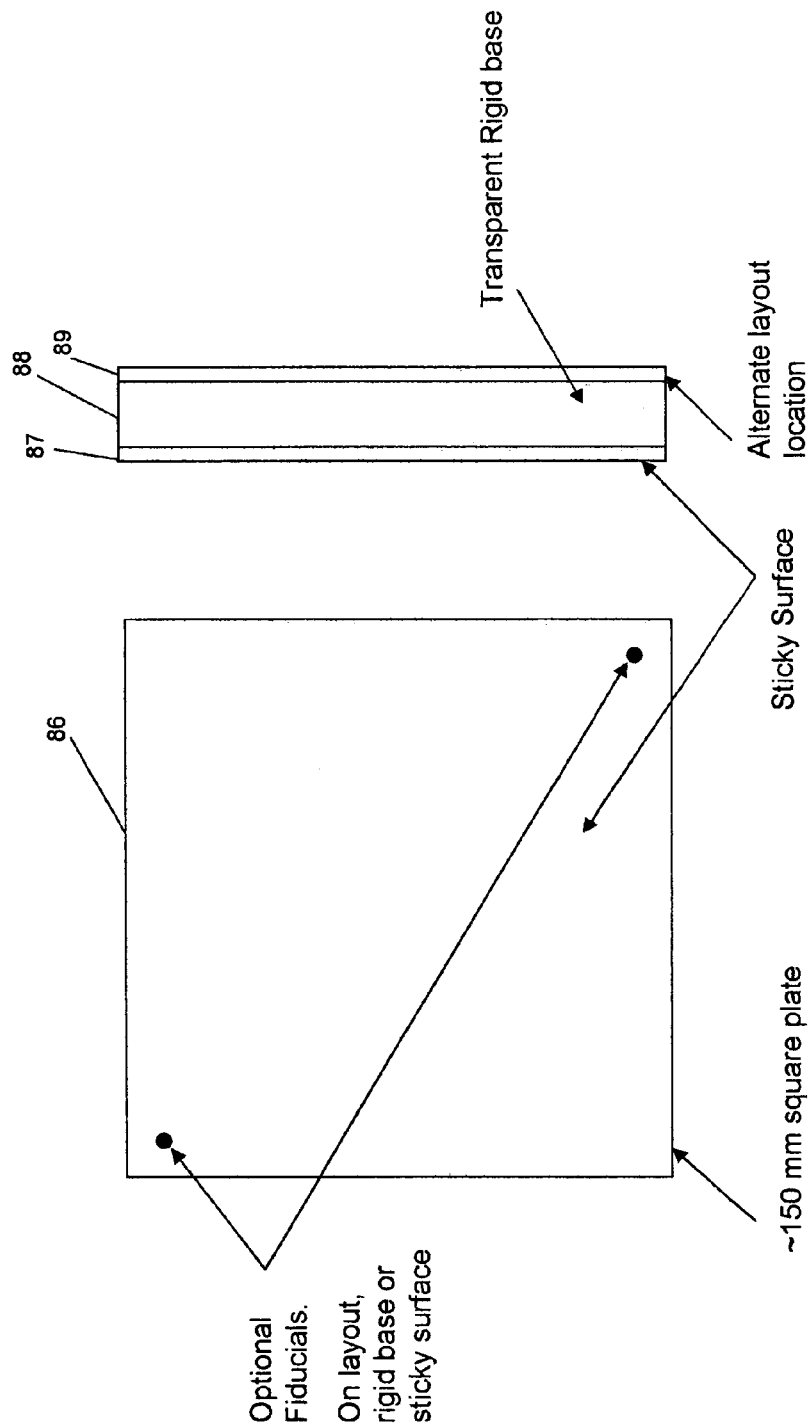
Figure 16. Variation of Placement Fixture of Figure 2. The variation is also applicable to the fixture of figure 9.

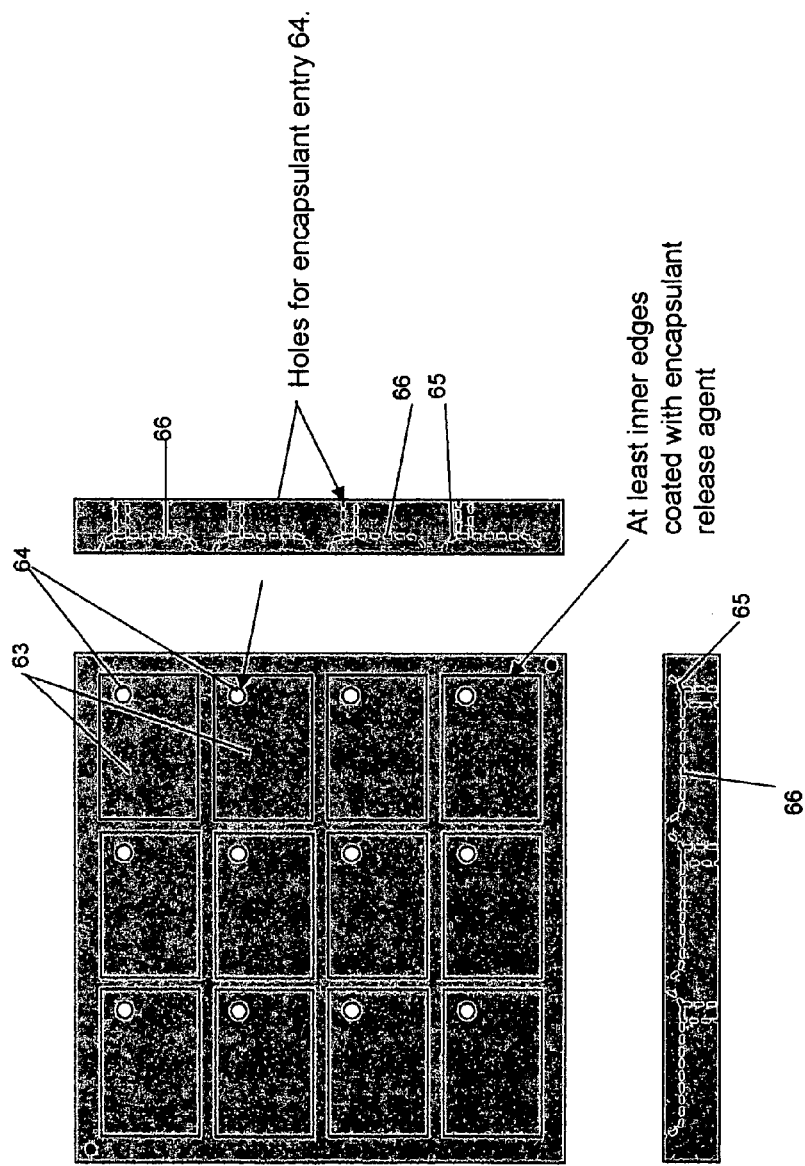
Figure 17. One of the two containment fixtures for use with the assembly process of Figure 15. Second containment fixture is similar.

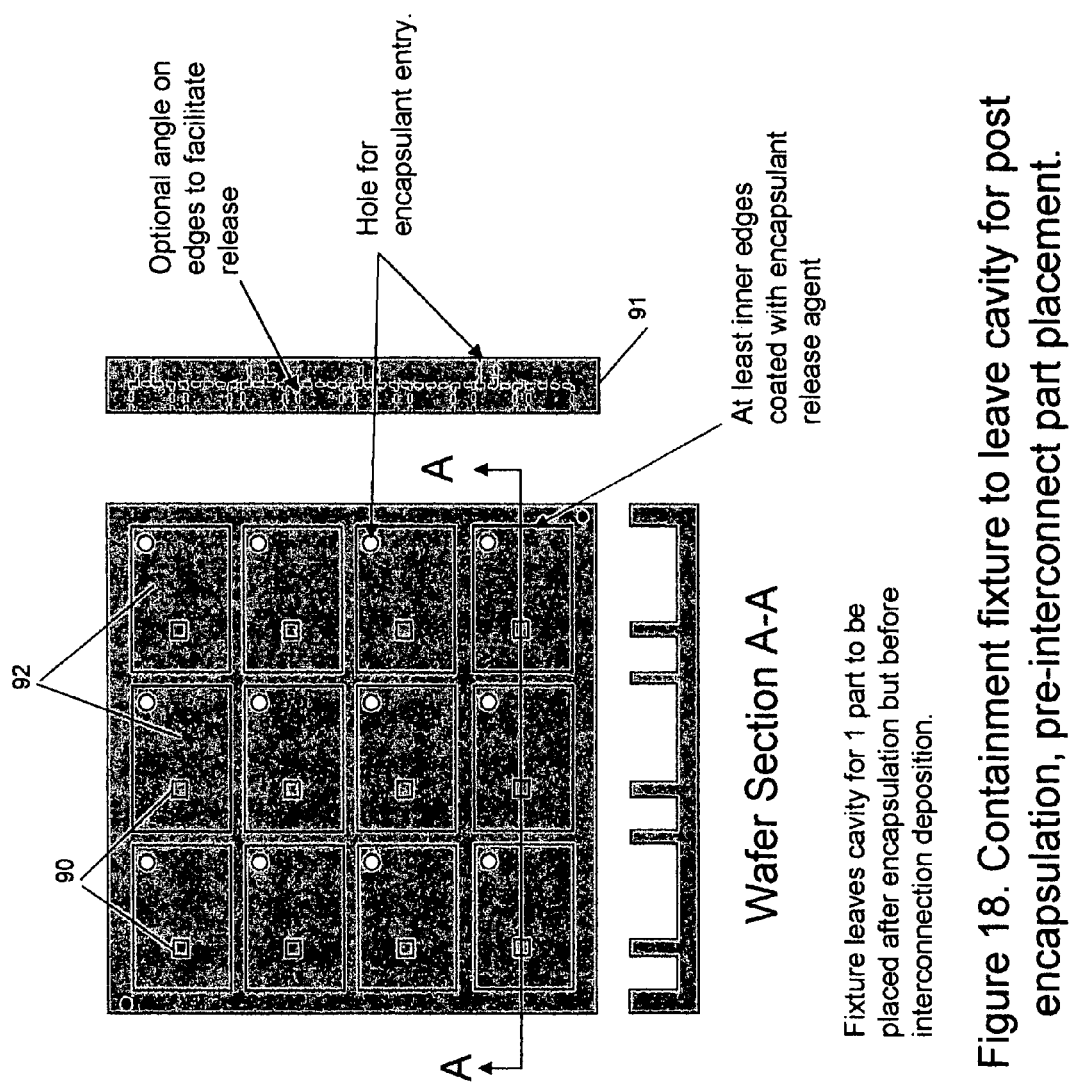
Figure 18. Containment fixture to leave cavity for post encapsulation, pre-interconnect part placement.

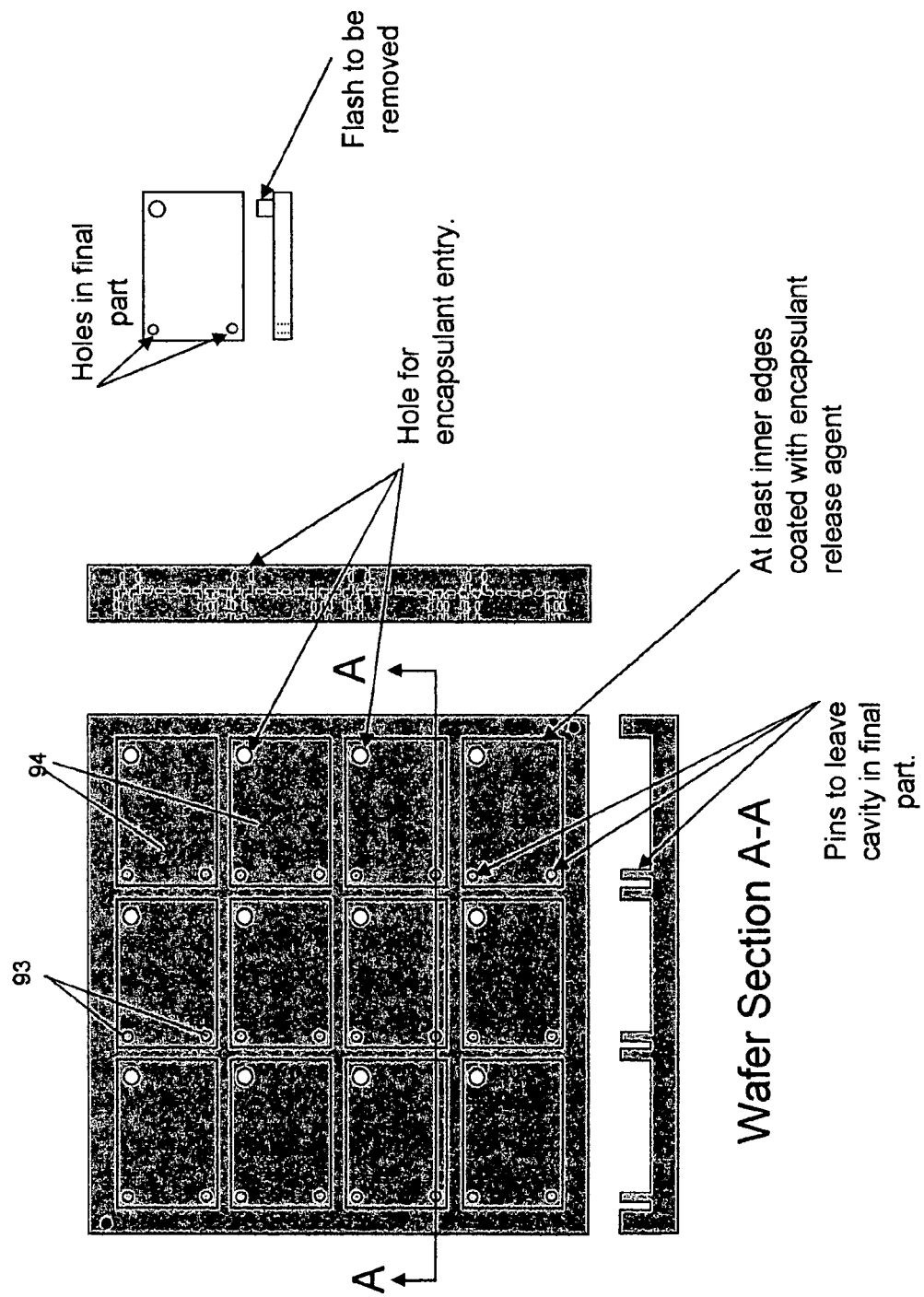
Figure 19. Containment fixture to leave holes in final part.

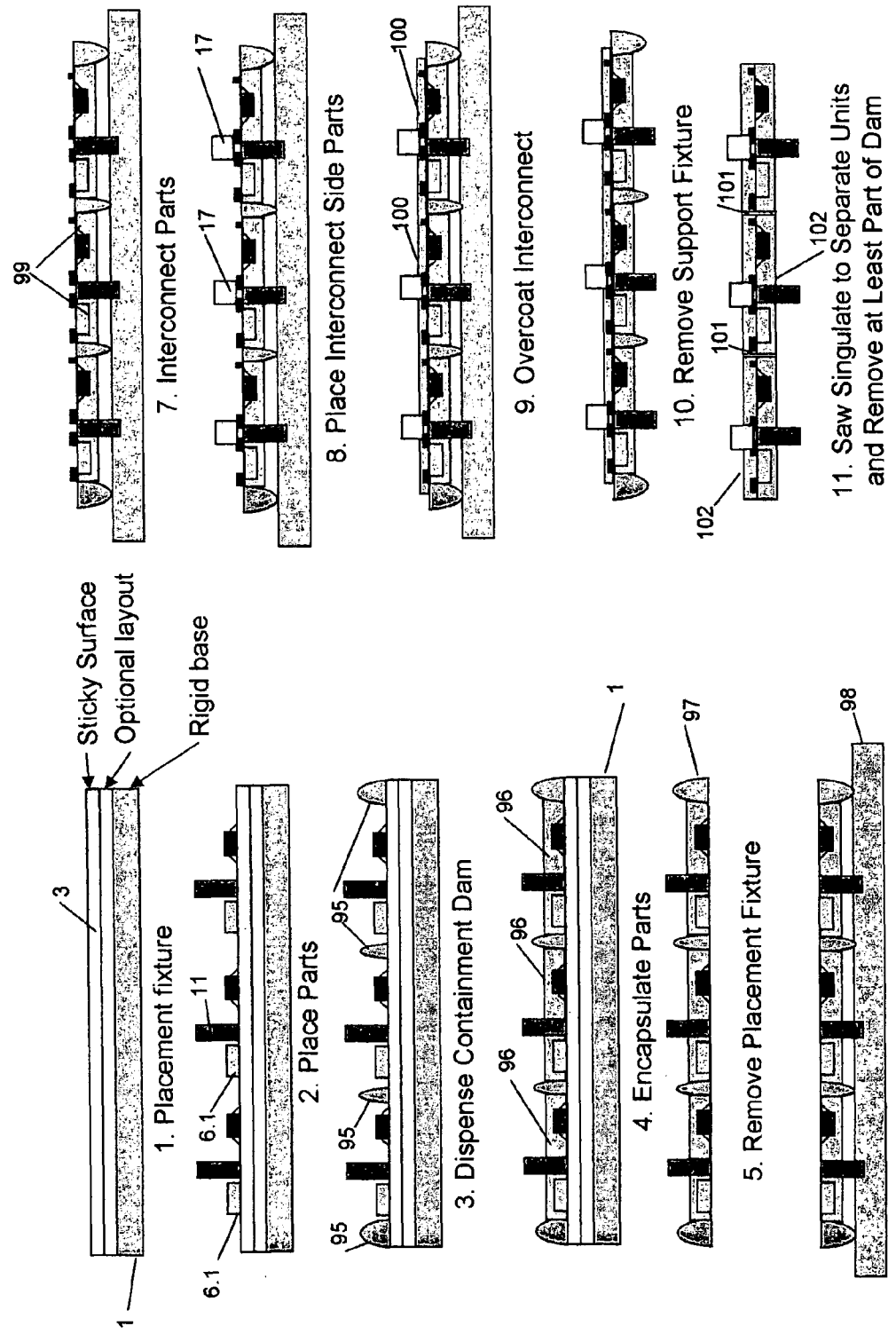
Figure 20. Eleventh embodiment of the assembly process.

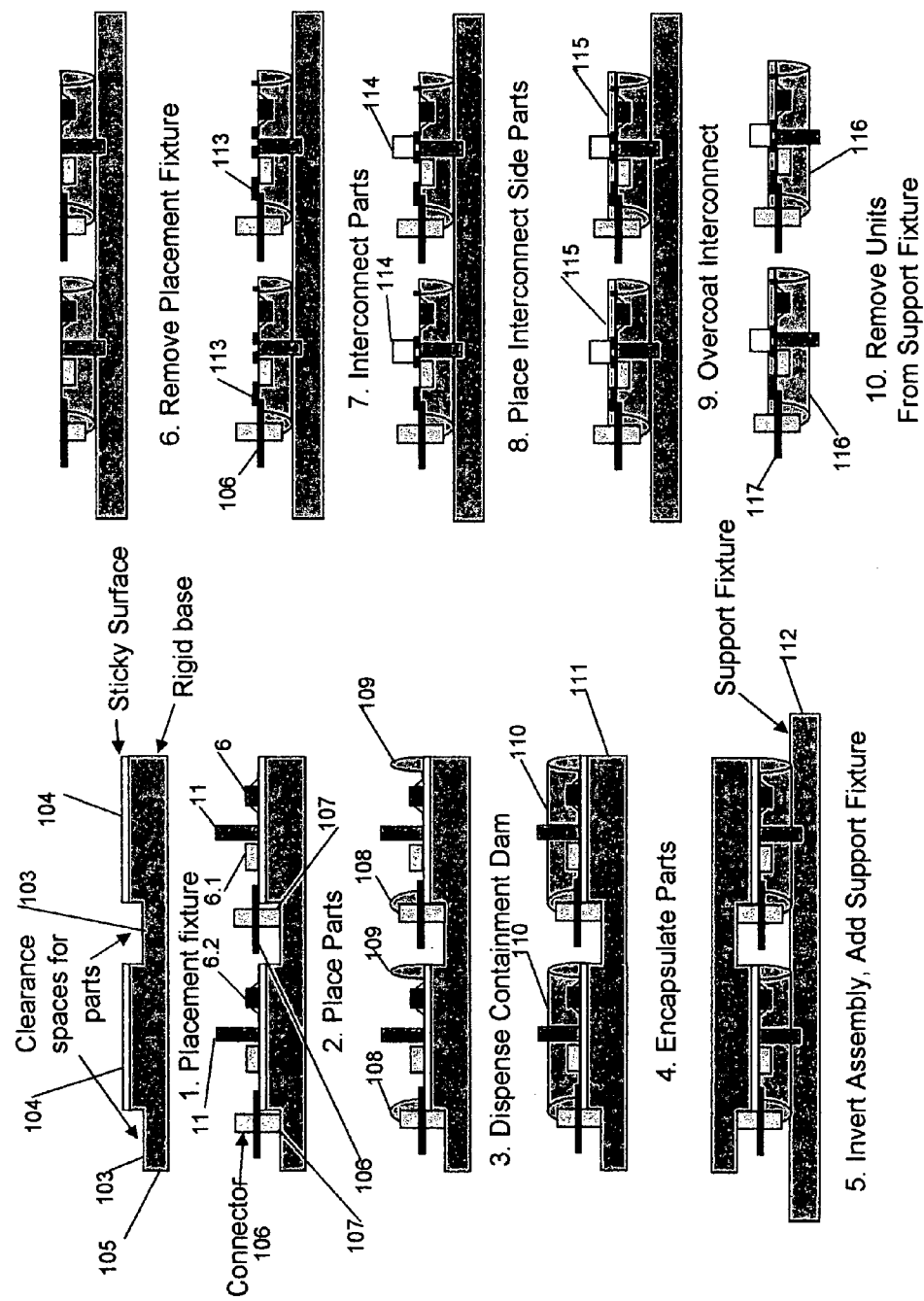
Figure 21. Twelfth Embodiment of the Assembly Process.

PROCESS FOR PLACING, SECURING AND INTERCONNECTING ELECTRONIC COMPONENTS

CROSS-REFERENCE TO RELATED APPLICATIONS

This application is the US national phase of PCT International Application No. PCT/US2008/011693 (filed Oct. 14, 2008); which in turn claims the priority of U.S. Provisional Application Nos. 60/960,823 (filed Oct. 16, 2007) and 61/006,571 (filed Jan. 22, 2008).

FIELD OF THE INVENTION

The present invention relates to the field of electronic component assembly and more specifically to the manufacture and assembly of electronic products using fewer process steps than are used with conventional assembly methods. It further relates to assembling electronic products by a process that does not require temperatures higher than those encountered in normal operating environments rather than the higher temperatures often used in electronic component assembly, such as the reflow temperatures associated with the use of solder. In particular, the present invention relates to a method for fabricating an electronic assembly which enables the assembly and interconnection of surface mount components and/or other electrical, electronic, electro-optical, electro-mechanical and user interface devices with external I/O contacts on a planar surface.

BACKGROUND OF THE INVENTION

The electronics industry is constantly seeking lower cost, faster methods to assemble electronics equipment and faster methods to bring new products to market, all of which the current invention facilitates. In addition, the industry desires doing so with less environmental impact. Most traditional electronic component assembly methods utilize solder and thus expose many of the components and parts used in electronic assemblies to the melting point of the solder which is typically in the range of 180° C. to 250° C. The current invention eliminates the need to expose electronic components to these temperatures and thus broadens the number of components, materials and methods that can be used in such assemblies as well as the materials and methods used to manufacture the components themselves.

In addition, in recent years legislation (particularly the RoHS regulations) has been enacted in a variety of locations that require the elimination of certain materials and elements from electronics products. Among those to be eliminated is lead, a major constituent of conventional solder, which the current invention need not utilize.

Finally, the industry desires to build devices for lower cost, which can be accomplished by eliminating assembly steps, processes and parts such as circuit boards and enclosures. In addition, this invention broadens the selection of parts that may be incorporated to include parts made with potentially lower cost materials that are unable to tolerate conventional soldering temperatures.

BRIEF DESCRIPTION OF THE DRAWINGS

The present invention is illustrated by way of example, and not by way of limitation, in the accompanying drawings in which like reference numerals refer to the same or similar elements and in which:

FIG. 1 illustrates the eleven process steps utilized in implementing a first embodiment of the invention.

FIG. 2 illustrates top and side views of a placement fixture suitable for use with the first embodiment of the invention.

FIG. 3 illustrates a containment fixture suitable for use with the first embodiment of the invention. Although this and other containment fixtures are shown as a single structure it should be noted that, if desired, the fixture can be assembled from a group of segments to provide flexibility in the configuration of the containment fixture.

FIG. 4 illustrates top and side views of a support fixture suitable for use with the first embodiment of the invention.

FIG. 5 illustrates the process steps utilized in implementing a second embodiment of the invention FIG. 6 illustrates top and side views of a containment fixture suitable for use in implementing the second embodiment of the invention.

FIG. 7 illustrates the assembly process steps used in accordance with a third embodiment of the present invention with a sticky surface on top of a release surface (which is a preferred design which can be used with any of the other embodiments of the present invention) and also dual encapsulant deposition, also a preferred feature. Dual layer release and dual encapsulant deposition can be utilized independently and are shown together here to minimize the number of embodiments described. The overcoat layer is, sometimes referred to as the dielectric layer. The term "encapsulant" as used herein means a sealant material which is applied in fluid form and subsequently solidifies on cooling (e.g., a thermoplastic) or on curing (e.g., an epoxy resin). The function of the encapsulant is to: i) provide environmental protection; ii) structural integrity; and iii) a desired form factor for the components (parts) after interconnection and singulation.

FIG. 8 illustrates the assembly process steps used in accordance with a fourth embodiment of the present invention which utilizes a dual release layer placement fixture and multiple interconnect layers.

FIG. 9 illustrates top and side views of a variation of the placement fixture of FIG. 2 with dual release surfaces for use in the process of FIG. 7 or 8 (or 1 or 2, etc. as noted above).

FIG. 10 illustrates an expanded assembly process in accordance with a fifth embodiment of the present invention using a second containment fixture that allows encapsulation of parts placed on the second, back side of the assembly after the placement fixture is removed.

FIG. 11 illustrates an expanded assembly process in accordance with a sixth embodiment of the present invention that allows parts that cannot tolerate the primary encapsulation to be placed after the primary encapsulation is complete.

FIG. 12 illustrates an assembly process in accordance with a seventh embodiment of the present invention having a second interconnect layer on top of the first dielectric layer and a second dielectric layer on top of the second interconnect layer.

FIG. 13 illustrates an assembly process in accordance with an eighth embodiment of the present invention having a thin interconnect overcoat layer that can be readily separated when units, (i.e., electrically interconnected components), are removed from the encapsulation frame.

FIG. 14 illustrates an assembly process in accordance with a ninth embodiment of the present invention which provides complete encapsulation of the interconnect structure.

FIG. 15 illustrates an assembly process in accordance with a tenth embodiment of the present invention using a more complex containment fixture that gives the encapsulated units a final shape, thereby eliminating the need for an additional enclosure or cover.

FIG. 16 illustrates top and side views of an alternative embodiment of the placement fixture of FIGS. 2 and 9.

FIG. 17 illustrates top, side and edge views of an encapsulation fixture suitable for use with the process of FIG. 15.

FIG. 18 illustrates top, side and edge views of an encapsulation fixture suitable for use with many of the processes of the present invention with an added feature that leaves a hole, or holes, in the final units when needed to accommodate parts that are added to the parts assembly after all of the earlier steps are complete.

FIG. 19 illustrates top, side and edge views of an encapsulation fixture suitable for use with the process of FIG. 15.

FIG. 20 illustrates an assembly process in accordance with an eleventh embodiment of the present invention that does not use a containment fixture but rather utilizes a "dam" of needle dispensed, high viscisity polymeric material that provides a "wall" that contains the encapsulant. As used herein and in the claims, the term "containment means" is intended to encompass both a containment fixture as previously described and also a dam as illustrated in FIG. 20.

FIG. 21 illustrates an assembly process in accordance with a twelfth embodiment of the present invention that allows incorporation of partially encapsulated or of non-encapsulated components, such as electrical contacts, in a manner so as to allow them to protrude through the side of a unit.

DESCRIPTION OF THE INVENTION

In the following description and in the accompanying drawings, specific terminology and drawing symbols are used to provide a complete understanding of the present invention.

FIG. 1 illustrates a first embodiment of the assembly process of the present invention. The first step utilizes a placement fixture 1 that comprises at least two elements. FIG. 2 illustrates this placement fixture in greater detail. The first element is a substantially rigid base 2 that may be of any size or shape but is typically a square 100 to 150 mm on a side or a rectangle 200 mm to 300 mm on a side. The base can be made from a variety of material but one preferred material is glass, approximately 2 to 6 mm thick, which being transparent provides an advantage as will be explained in greater detail shortly. The second element is a sticky surface 3 covering one surface of the glass, the purpose of which will also shortly become apparent. The sticky surface may be implemented in a variety of ways. One preferred method is to use a gel coating such as that available from Gel-Pak of Hayward California named WF-X8 in a sheet form with an adhesive backing that facilitates its attachment to the glass or other rigid base (substrate). The 0.017" thick version of WF-X8 is particularly suitable. A third, useful feature is fiducials 4 located at pre-determined positions on the placement fixture. Their purpose will also become apparent shortly. Fiducials can have any shape but are often circular with high contrast and are usually used as a pair. They may be made with a mark, by making a hole or by attaching a pin to the surface. A further option in making the placement fixture, is to include a layout 5 between the base and the sticky layer of the parts to be placed that shows their location. This is one reason why a transparent base is advantageous and although this is not a necessary requirement, it is frequently useful.

The second step in the process as shown in FIG. 1 entails placing a plurality of electronic parts (components) such as resistors, capacitors or integrated circuits, etc.,which can be the same or different and shown here as 6.1, 6.2 and 11, which together comprise a "unit" at the desired locations. Although FIG. 1 shows only 3 units (sets) of 3 different parts, a multiplicity of the same or different parts and/or units can suitably be placed on the sticky surface. In addition, the part pattern may be repeated multiple times to allow many units to be processed simultaneously as an array. In the example shown, the array is repeated 3 times across the fixture. Array assembly processes are commonly used in the electronics assembly industry to minimize handling.

The purpose of the sticky surface 3 is now apparent; is to temporarily hold the parts 6.1, 6.2 and 11 in place while additional parts are placed and the subsequent process steps are implemented. Part 11, which protrudes relatively high might, for example, be an electrical contact or a surface mount electrical connector. The purpose of the fiducials 4 is now also apparent. They provide reference points with respect to which parts 6.1, 6.2 and 11 are oriented and placed. Placement of parts on a flat surface is a common process in the electronics assembly industry and is frequently done using machines that take parts from reels, trays, etc. and place them in a desired configuration on a substrate. The OPAL II machine from Assembleon is one such suitable machine.

The third step in the process shown in FIG. 1 is adding the containment fixture 7 after the parts 6.1, 6.2 and 11, are placed on the sticky surface 3. The containment fixture 7 is shown in FIG. 3. The containment fixture 7 typically is approximately the same size as the placement fixture 1 with which it is to be used. This is not a requirement and the containment fixture 7 may, of course, be smaller than the placement fixture 1. However, it is necessary for the containment fixture 7 to be large enough to enclose all of the parts 6.1, 6.2 and 11 which it is desired to be located on placement fixture 1. The inside surface 8 of fixture 7 should have a surface that will prevent encapsulant, that will be added in a subsequent step, from adhering to fixture 7. Alternately, a release agent may be put on the inside surface of fixture 7. One option is to make the entire fixture out of a non-stick material such as Teflon (polytetrafluoro ethylene) or to coat the surface thereof with Teflon. A further method of ensuring that encapsulant will facilitate release from the containment fixture is to put an angle or bevel on the inside surface 8 of fixture 7. When fixture 7 is in place on the sticky surface 3 that stickiness helps hold fixture 7 in place. Alternately, an auxiliary holding means such as a clamp or clamps may be used to keep the containment fixture in close contact with the placement fixture to effect a "seal" between the two to prevent encapsulant from leaking out of the containment fixture. FIG. 3 shows that the containment fixture may also have fiducials 9 to facilitate placing it accurately. Alternatively, the fiducials of the containment fixture can be replaced by a pin or a hole intended to interface with the fiducials located on the placement fixture.

The fourth step shown in FIG. 1 is encapsulating the parts by dispensing an encapsulating material 10 over them to a controlled depth. The encapsulant can be any of a variety of known materials. Useful characteristics of the encapsulant include that it be low cost, flow around the parts adequately, not adhere to the sticky surface or the containment fixture, have a sufficiently high modulus when in the solid state to provide the strength required in the final product, not deteriorate due to water absorption or other characteristics of the service environment, accept subsequent marking and be transparent. Suitable materials include an epoxy such as PT-1002 made by Pacific Polytech Corporation 15 Commercial Blvd., Novato, Calif. or Hysol FP4450 HA or 4652 from Henkel Loctite Corp. The amount of material dispensed depends on the design, size of the parts, etc. In this Figure, the encapsulant does not totally cover all of parts 11 but leaves the upper portion of parts 11 exposed. Parts may advantageously be left partially exposed for a variety of reasons such as allowing light to reach a sensor, allowing access to a switch, preventing filling a space in a part with encapsulant, allowing for subsequent attachment of another electrical component such as a wire utilizing mechanical fastening such as a screw, a Faston or attachment with solder, welding, etc. After the encapsulant has solidified the assembly is ready for further processing.

The fifth step is to remove the encapsulated parts assembly 12 from fixtures 1 and 7.

The sixth step is to invert the assembly 12 and place it on the support fixture 13. The support fixture 13 is shown in further detail in FIG. 4. Support fixture 13 is sized to match the assembly 12 and may also have fiducials 14 that are e.g., marks, holes or a pin, to facilitate locating the assembly 12. In addition, fixture 13 will have cutouts or clearance holes 15 to accommodate parts 11 that protrude above the surface of encapsulant 10.

The seventh step shown in FIG. 1 is to interconnect the electronic parts 6.1, 6.2 and 11. The following description of suitable methods of interconnect deposition is applicable to all Figures that include an interconnect step. One suitable method is to needle dispense a conductive ink 16 in a suitable pattern utilizing a programmed dispenser such as a Camelot. One suitable ink is 40-3920, Electrically Conductive Ink from Epoxies, etc., 21 Starline Way, Cranston, R.I. Alternate suitable methods of interconnecting the electronic parts 6.1, 6.2 and 11 include, screen printing ink in a suitable pattern, ink jet printing a suitable pattern, plating an interconnect structure using additive printed wiring board methods that can suitably include blind vias, etc. The interconnect should adhere to the encapsulant, provide adequate electrical conductivity and retain these properties through subsequent processing and over the useful life of the product.

The eighth step in FIG. 1 is to add parts 17 to the interconnect side of the assembly. The parts 17 can be placed using conventional pick and place equipment such as the Assembleon OPAL II mentioned earlier, or by hand if that is appropriate. The parts can also be attached using a conductive ink such as that which forms the interconnections or with additional conductive epoxy added at contact point 18.

The ninth step is overcoating the interconnected parts with a protective layer 19. One purpose of this layer 19 is to prevent damage to the interconnect e.g., from mechanical effects such as scratches and scrapes. A second purpose of this layer is to further strengthen the assembly 12. Yet another purpose is to more firmly attach the backside components 17 to the assembly 12. The protective layer may suitably be made using the encapsulation material used earlier in step 4. Alternately, another encapsulation material may be used. These materials can be applied in a variety of ways including pouring using a containment fixture similar to 7, or with a roller if backside components are not present, etc. The result is a fully protected array of units 21.

The tenth step in FIG. 1 is to saw singulate the assembly 12 into individual units. This can be done using a dicing saw, such as a K&S Model 780 Dicing Saw and a suitable blade. The cuts 21 are made in the locations and in suitable directions so as to separate the individual units 23 that made up the assembled array.

The units are now complete and ready for further processing such as incorporation into a finished electronic device.

FIG. 5 illustrates a second embodiment of the process of the present invention. This embodiment is similar to that of FIG. 1, except it utilizes a slightly different containment fixture 24 shown in detail in FIG. 6.

The process of this embodiment is as follows.

The first nine steps in the process shown in FIG. 5 are generally the same as those shown in FIG. 1.

The third step in the process shown in FIG. 5 is adding the containment fixture 24 after all of the parts 6.1, 6.2 and 11 are placed on the sticky surface, 3. However, the containment fixture 24, shown in greater detail in FIG. 6, differs from that of FIG. 3. The containment fixture 24 is typically about the same size as the placement fixture 1 with which it is to be used. This is not necessary, and again the containment fixture 24 may be smaller than the placement fixture 1. It is only necessary for the containment fixture 24 to be large enough to enclose all of the parts 6.1, 6.2 and 11 located on the placement fixture 1. In addition, the individual pockets 25 in containment fixture 24 for the units in the array, need not be rectangular but can be of any appropriate shape. In addition, the coated edges 27 need not be flat surfaces but can be curved to provide a rounded edge. The containment fixture 24 is designed to go between the parts 6.1, 6.2 and 11 on placement fixture 1. At least the inside surfaces 27 of the fixture 24 should have a surface that will prevent the encapsulant, that will be added in a subsequent step, from adhering to the fixture. Alternately, a release agent may be put on the surfaces 27. As previously described for FIG. 3, one option is to make the entire fixture out of Teflon or to coat its surface with Teflon. A further method of ensuring that encapsulant will release from the containment fixture is to put an angle on the inside surfaces 25 of fixture 24. When fixture 24 is placed on the sticky surface 3, that stickiness helps hold the fixture 24, in place. FIG. 6 shows that the containment fixture can have fiducials 26 to facilitate placing it accurately. Alternately, the fiducials can be replaced by a pin or a hole intended to interface with the fiducials on the placement fixture.

The fourth step shown in FIG. 5 is encapsulating the parts by dispensing an encapsulating material 10 over and around the parts 6.1, 6.2, 11 in each cavity 25 to a suitable depth. The encapsulant can be any of the variety of materials, as previously described. Desirable characteristics of the encapsulant include that it be low cost, flow around the parts adequately, not adhere to the sticky surface or the containment fixture, have a high enough modulus to provide the strength require in the final product, not deteriorate due to water absorption or other characteristics of the environment, accept subsequent marking and be transparent. In this illustration, the encapsulant does not cover all of the parts 11 but leaves part of some of them exposed. Parts may be left partially exposed for a variety of reasons such as allowing light to reach a sensor, allowing access to a switch, preventing filling a space with encapsulant, etc. After the encapsulant has solidified the assembly is ready for further processing.

The fifth step is to remove the encapsulated part assembly 28 from the placement fixture 1. At this time the containment fixture 24 is part of the assembly.

The sixth step is to invert the assembly 28 and place it on support fixture 13. The support fixture 13 is as described in FIG. 4. Support fixture 13 is sized to match the assembly 28 and may have fiducials 14 that are marks, holes or a pin, to facilitate locating the assembly 28. In addition, fixture 13 has cutouts or clearance holes 15 to accommodate parts 11 that protrude above the surface of the encapsulant 10 and the surface of containment fixture 24.

The seventh step shown in FIG. 5 is to interconnect the electronic parts 6.1, 6.2 and 11. One suitable method is to needle dispense a conductive ink 16 in a suitable pattern utilizing a programmed dispenser such as a Camelot, Model 370 dispenser using an auger dispense pump with a #25 needle. One suitable ink is 40-3920, Electrically Conductive Ink from Epoxies, etc., 21 Starline Way, Cranston, R.I. Alternate methods of interconnecting the electronic parts 6.1, 6.2 and 11 include screen printing ink in a suitable pattern, ink jet printing a suitable pattern, plating an interconnect structure using additive printed wiring board methods which can include blind vias, etc. The interconnect should adhere to the encapsulant, provide adequate electrical conductivity and retain these properties through subsequent processing and for the useful life of the product.

The eighth step in FIG. 5 is to add parts 17 on the interconnect side of the assembly. The parts 17 can be placed using conventional pick and place equipment such as the Assembleon OPAL II mentioned earlier, or by hand if that is useful. The parts can be attached using a conductive ink such as that which forms the interconnect or with additional conductive epoxy added at contact point 18.

The ninth step is overcoating the interconnect with a protective layer 29. One purpose of this layer 29 is to prevent damage to the interconnect, especially from mechanical effects such as scratches and scrapes. A further purpose is to more firmly attach the backside components 17 to the assembly 12. The protective layer may be made using the encapsulation material used earlier in steps 4 and 10. Alternately, another encapsulating material may be used. These encapsulating overcoating materials can be applied in a variety of ways including pouring using a containment fixture similar to 24 or with a roller if backside (interconnect side) components are not present, etc. The result is a fully protected array of units 30 encased in containment fixture 28.

The tenth step is removing the support fixture 13 from the array of units 30 encased in the containment fixture 28.

The eleventh and final step is removing the individual parts 31 from containment fixture 28. The units are now complete and ready for subsequent processing.

FIG. 7, step 1, shows an alternative version of the assembly process of FIG. 1. The processes of both FIGS. 7 & 8 utilize a more complex placement fixture 1 as shown in FIG. 9. The purpose of this more complex fixture will be explained shortly. This fixture, as shown in FIG. 9, has a sticky surface 3 that may be implemented using a single sided tape, such as one made from du Pont Kapton polymer, a 6" wide, single sided 0.002 inch thick tape available from Echo Engineering of Milpitas Calif., that is placed, sticky side up, on release surface 32. Release surface 32 can suitably be made from a material such as GelPak WF-X8. Glass, about 5 mm thin, makes a suitable rigid base 2 and allows a layout plan 33 to be placed on the bottom of the placement fixture so as to be visible from the top to aid hand placement of parts.

In FIG. 7, steps 2 & 3 are similar to those of FIG. 1 that results in parts 6.1, 6.2 and 11 being placed in specific locations with containment fixture 7 being placed around them. In step 4 encapsulant 34 is dispensed into the containment fixture and allowed to flow around and under the parts 6.1, 6.2 and 11. The amount dispensed is dependent on the particular parts and size of the array but should be sufficient to wet the entire upper surface of the placement fixture 3 and also fill the voids between the sticky surface 3 and the bottom of the parts 6.1, 6.2 and 11. It should not be so much, however, as to cause capillary action to lift parts 6.1, 6.2 or 11 off of the sticky surface 3 or cause any of parts 6.1, 6.2 or 11, that would be buoyant in the encapsulant, to float. After the encapsulant is dispensed, it is solidified by cooling, solvent removal, or if appropriate, at least partially cured. During the solidification process, the assembly should be kept reasonably level so that this first layer of encapsulant has a substantially uniform thickness over the entire area of the parts array.

In FIG. 7 step 5 shows the dispensing of the remainder of the encapsulant 36. This dispensing is followed by drying or total curing of the encapsulant. After step 5, the parts are fully encapsulated.

Step 6 is the first step in removal of the encapsulated array from the placement fixture. First, the containment frame 7 and encapsulated array of parts 12 with sticky surfaced tape 3 still attached are removed from release surface 32 as a complete unit. Next, sticky surfaced tape 3 is peeled off of the encapsulated array 12 leaving the plurality of contact points 35 exposed. This two step removal process enables sticky surface 3 to tightly grip the encapsulant and particularly the parts yet allows for sticky surface 3 as a tape to be removed with a peeling action. To peel off tape 3 the tape must be accessible and hence it is enabled to be removed from the rigid base by a release surface 32.

Step 7 shows that the containment frame 7 has also been removed from the encapsulated array 12. Frame 7 may be removed at this stage or, if desired, left in place to assist handling through subsequent stages and then removed when convenient to do so.

Step 8 comprises several sub-steps. First, as in FIG. 1, the array 12 is inverted and placed on support fixture 13, as shown in FIG. 4. Support fixture 13 may or may not be needed. Fixture 13 is shown for completeness but may be excluded if parts 11 do not protrude above encapsulation layer 36. If necessary, the part contact points 35 may be cleaned of any contaminants that might interfere with the interconnect 16 including any encapsulant that may have gotten on them during the encapsulation process, and made ready for the next step.

Step 9 is interconnection deposition. The interconnect structure can be deposited using a variety of known techniques such as screen printing, electroplating, ink jet dispense or needle dispense. An example of a specific method is the use of silver epoxy ink #H2OE from Epoxy Technology of Massachusetts which is dispensed with a Camelot, Model 370, dispenser using an auger dispense pump with a #25 needle.

Step 10 is placement of parts on the interconnect side on top of the interconnect structure. They may be connected using more conductive inks if the ink previously used for the interconnect is suitable, or with conductive epoxy.

Step 11 is depositing a protective layer 19 on the interconnect structure to protect it from the environment. The encapsulant material dispensed in steps 4 and 5 is generally suitable and can be applied in a variety of ways such as, for example, brushing on.

Step 12 is saw singulation at points 21 as in step 10 of FIG. 1.

Step 13 is removing the individual units 23 from the support fixture. They are now complete or ready for any subsequent step or steps.

The process of FIG. 8 through step 7 is similar to FIG. 1 through step 7.

Step 6 is similar to that of FIG. 1 step 8 except it includes the added stage of cleaning the exposed part contact points 35, if necessary, as described for FIG. 7, step 8.

Step 7 is deposition of the interconnect structure using techniques such as screen printing, electroplating, ink jet dispense or needle dispense as already described.

Step 8 is the deposition of a dielectric layer 37 on top of the interconnect structure 16. The purpose of the dielectric layer is to prevent connection between the initial interconnect layer 16 and the second interconnect layer 96, deposited in step 9 using methods the same as or similar to those used for depositing the first layer 16. Dielectric layer 37 will have holes 38 (vias) if connection between the two conductive interconnect layers 16 and 96 is required and must also provide isolation between the two interconnect layers where they cross when connection is to be avoided. The dielectric may be deposited using techniques such as screen printing, lithographic methods as used with printed circuit board design ink jet printing, needle dispense or other known suitable means.

Step 9 is the deposition of a second interconnect layer 96 using the same or similar methods to those of step 7 to deposit the first interconnect layer.

Step 10 is the deposition of a second dielectric layer 95 over the $2^{nd}$ interconnect layer 96.

Steps 9 and 10 can be repeated multiple times to build up multiple interconnect layers if required by the end product design.

Step 11 is the application of a protective overcoat 39 to protect the interconnect structure from the environment. This overcoat 39 may be excluded if not needed, or be of the same material used for the encapsulant in step 4, or of another material appropriate for the purpose. The encapsulant can be applied with a brush, screen printed, etc, or other suitable means.

Step 12 is saw singulation at points 21.

Step 13 is removal of the individual units 23 from the support fixture. The units are now complete and suitable for further processing, if desired.

FIG. 10 illustrates a fifth embodiment of the process of the present invention that allows parts to be placed and totally encapsulated on the back side of the first component layer using second support and containment fixtures.

Steps 1 through 8 of FIG. 10 are substantially similar to those of FIG. 5 and therefore need not be described again.

Step 9 shows the placement of a second containment fixture 40 on top of assembly 28 resulting from step 8. This fixture is similar to that of FIG. 6 and has ribs 41 that match the first containment fixture 24. Placement may be aided by fiducials or by pins and matching holes located at suitable points similar to those shown for the fiducials.

Step 10 is the dispensing of a suitable quantity of encapsulant 42 into the individual cavities 25 of the second containment fixture 41.

Step 11 is removal of the encapsulated parts and containment fixtures 43 from support fixture, 13.

Step 12 is removal of the finished parts 23 from the two containment fixtures 28 and 40. The, parts 23 are now ready for further processing.

The procedure of FIG. 10 can be done using any of the placement fixtures described in FIG. 2, 9 or 16.

FIG. 11 illustrates a process that allows parts to be included in an assembly that for some reason may not tolerate the encapsulation process.

Step 1 and 2 are similar to those of FIG. 5. The FIG. 11 process can utilize any of the placement fixtures shown in FIG. 2, 9 or 16, but that of FIG. 9 is preferred for many applications.

Step 3 shows the placement of "place holders" 44. Place holders are dummy parts that have a footprint slightly larger that of the real part that will eventually go in this location, are high enough to project above the encapsulant, have a surface the encapsulant will not stick to and will preferably be slightly tapered to facilitate their removal after the encapsulant is solidified.

Step 4 shows placement of the containment fixture 24.

Step 5 shows the dispensing of the encapsulant 10 into the individual cavities 25.

Step 6 shows the holes 45 remaining in the encapsulant when the "place holders" are removed from the encapsulated units.

Step 7 shows placement of the final parts 46 in the cavities 45. It may be necessary to use a glue or some adhesive that the sensitive parts will tolerate, such as room temperature curing epoxy, Crazy Glue (cyano acrylate) etc., to hold them rigidly in place for subsequent process steps at points 47 where they contact the encapsulant.

The final parts in FIG. 11 are shown as going all of the way through the encapsulant so they to can be placed before the placement fixture is removed although this is not always necessary. The place holders can be totally covered by the encapsulant and removed after the placement fixture is removed. The final parts can then be placed in the resulting cavities and again held, when needed, with additional adhesive.

Steps 8 through 14 are similar to steps 5 through 11 of FIG. 5 and therefore need not be reiterated.

FIG. 12 illustrates an embodiment of the present invention that minimizes the number of steps required to complete the assembly. The procedure through step 7 is similar to that of FIG. 8. It differs in step 8 because the dielectric is not deposited on the separation edge 44 of the encapsulation fixture.

Steps 9 and 10 build up the interconnect structure with an additional layer of interconnect 45 and dielectric 46. These two steps can be repeated yet again to add additional interconnect layers as required by the end use application. In all, cases, however, the dielectric is not deposited on the separation edges of the encapsulation fixture.

Step 11 is removing the support fixture 47 from the encapsulation frame 48 that holds the individual units 49.

Step 12 is the removal of the individual units 49 from the cavities in the encapsulation frame. The, units, 49, are now ready for further processing, if needed.

FIG. 13 illustrates a further embodiment of the invention similar to that shown in FIG. 12. The process is substantially similar through step 10 so a detailed description of these steps need not be repeated.

In step 11, the final dielectric layer is overcoated with a thin protective layer 50. The purpose of this layer is to provide added protection from the environment for the interconnect structure consisting of the conductive layers 51 and dielectric layers 52.

Step 12 is again removal of the support fixture 53 from the encapsulation frame 54 that still holds the individual units 55.

Step 13 is removal of the individual units 55 from the encapsulation frame 54. It will often be desirable to facilitate removal of units 55 from fixture 54 by first cutting the overcoat 50 where the units are to be separated. The units 55 are now ready for further processing, if needed.

FIG. 14 illustrates an embodiment of the invention that is similar to the embodiment of FIG. 13 through step 10 but thereafter differs by incorporating a second encapsulation fixture to increase separation of the individual units and thus allow a more complete encapsulation.

Step 11 shows the addition of the second encapsulation fixture 56 that aligns and matches the first encapsulation fixture 57. In this embodiment, encapsulation fixture 56 is similar to that shows in FIG. 26. After the addition of the second fixture, additional encapsulant 58 is dispensed into the cavities of encapsulation fixture 56. This layer of encapsulant can be made as thick as desired by simply controlling the amount of material dispensed. Thicker material not only provides greater protection to the interconnect but also makes the complete part more robust.

Step 12 entails removal of the support fixture 59 the encapsulated units 60 from the containment fixtures 56 and 57. The units 60 are now ready for further processing, if needed.

FIG. 15 illustrates another embodiment of the invention that results in a finished unit that can have a variety of configurations. It utilizes encapsulation fixtures similar to those shown in FIG. 17.

Steps 1 and 2 are similar to those of earlier Figures. Parts 61 are positioned on placement fixture 1 with a machine such as an OPAL II from Assembleon. Any of the placement fixtures of FIG. 2, 9 or 16 may be used, but that of FIG. 9 is preferred.

Step 3 shows placement of the encapsulation fixture 62 over the parts.

FIG. 17 shows fixture 62 in further detail. The fixture has cavities 63 that include a "cover" 66, with holes 64 through which the encapsulant can be dispensed. The cavities 63 reflect the shape desired in the final part. The cavity in the example of FIG. 17 has rounded edges 65 for example, but other shape edges are also suitable. Also, the exemplary cavity 63 is rectangular but again other shapes can be accommodated. In all cases, however, the cavities should have a surface from which the encapsulant will release, and a geometry that allows the encapsulant to fill the cavity and allows the unit to be removed from the cavity.

Transfer molding or injection molding may be used as described below. If either of those processes is used, a more complex structure in the form of a mold may be sometimes required to contain the encapsulant. Those skilled in the art will know how to go from the less complex fixtures to a more complex mold suitable for use with either transfer or injection molding, should those prove to be advantageous for a particular application.

Continuing the description of FIG. 15, step 4 is the dispensing of encapsulant 67 into each of the cavities 63. The dispensing is best done using a process, such as the Camelot process described earlier, that controls the volume of material dispensed. The amount of material dispensed should be sufficient to fill the entire cavity and at least part of the fill hole 64. One should seek to eliminate voids in the encapsulant because these would be detrimental to the end product. Steps to minimize voids in encapsulant 67 can include degassing encapsulant 67 before dispensing it into cavities 63 and/or putting the assembly 80 after encapsulant is dispensed into a vacuum box to withdraw air, are two procedures suitable to minimize encapsulant voids.

Step 4 can be practiced utilizing transfer molding or injection molding. These processes allow the use of alternate materials that may have particularly desirable properties, such as formation to of a more precise or complex final configuration and/or provide lower cost through faster processing.

Step 5 is removal of the placement fixture 68 from the encapsulated parts 69 and assembly 70.

Step 6 is inverting the assembly 70 and, if needed, adding support fixture 71.

Step 7 is deposition of the first interconnect layer 72 and step 8 is deposition of the first dielectric layer 73.

Step 9 is deposition of the second interconnect layer 74 and step 10 is deposition of the second dielectric layer 75.

Steps 9 and 10 are similar to those described for earlier embodiments of the invention and can use similar methods. As with those embodiments, steps 9 and 10 can be repeated to build up multiple interconnect layers when needed for a particular end use application. Also, the exposed surface of the encapsulation fixture 76 is not coated with the dielectric but rather left clean.

Step 11 shows the result of placing a second encapsulation fixture 77 on top of the structure 78 resulting from step 10. It also shows encapsulant 79 dispensed to fill each of the cavities through fill hole 86. The details of the dispensing of step 4 also apply to this dispensing. As described above, an alternative method for dispensing the encapsulant is the use of transfer or injection molding.

Step 12 shows removal of support fixture 81 from the rest of the assembly 82.

Step 13 is removal of the units 83 from the encapsulation fixtures 62 and 77. The units 83 still have "flash" 84 left from excess material in the fill hole 86.

Step 14 shows the final unit 85 after removal of the flash 84. The units 85 are now ready for further processing, if appropriate.

FIG. 16 shows a variation of the placement fixture of FIG. 2. While FIG. 16 is noted as ~150 mm square to give the reader a sense of the proportions, any suitable size placement fixture can be used as long as it is larger than the array of units to be assembled. The fixture should preferably have a rigid base 88 which is transparent for this embodiment. The top 87 where parts are to be placed should be "sticky" to hold the parts in place until the encapsulant has solidified to hold them in place. The parts layout 89 on the bottom assists placing parts that are not placed by automatic equipment including those such as a battery, that are often placed by hand.

FIG. 17 has been described above during the description of FIG. 15.

FIG. 18 shows another variant of the containment fixture means suitable for use in an embodiment such as that of FIG. 11 that utilizes place holders 44 to provide cavities 45 into which sensitive parts 46 that for whatever reason cannot go through the encapsulation procedure, are subsequently placed and held in position with ancillary adhesive 47. Instead of placing individual place holders 44 on the placement fixture, the cavities 45 can be formed by a pedestal 90 built into the encapsulation fixture 91. While FIG. 18 shows only a single square pedestal 90 in each cavity 92, multiple pedestals, or pedestals of other shapes, such as rectangular, round, etc., can be utilized.

FIG. 19 shows another containment fixture with additional features. This fixture is similar that of FIG. 18 except the pedestals 93 in the cavities 94 are not place holders for sensitive parts but rather a method of providing a hole in the final assembly. While this FIG. 19 shows two pedestals that will result in two holes in the finished units, additional holes can be made at any desired location using similar pedestals. These holes can be used for multiple purposes; e.g., screws to hold the unit to another higher level assembly or as a hole through which a chain, for example, might loop.

While a drawing of a unit made using the fixtures in FIGS. 18 and 19 is not provided, those skilled in the art will understand from the foregoing descriptions of the variety of embodiments in FIGS. 5 and 10 thru 15 how this type of encapsulation fixture can be used to add this feature. FIG. 20 shows an embodiment of the invention that does not utilize a containment fixture as the containment means as shown for the earlier process embodiments but, instead, substitutes a polymeric "dam" 95 as the containment means that is customized to the unit being made Step 1 and 2 are similar to those describe for earlier embodiments of the process.

Step 3 is the formation of the dam 95. The important properties of a dam are: i) that it be high enough to retain a subsequently applied, low viscosity encapsulant, ii) not be so high that it forms an un-needed ridge, and iii) forms a continuous dam around the area to be encapsulated.

A dam might be made using a Camelot, as described earlier for interconnect deposition, utilizing a needle to dispense a suitable dam material. A suitable dam material might be one with a viscosity sufficient to enable the dam to retain its shape through a cure cycle, e.g., one that is dispensed hot and then cools to retain its shape or one that can be cured using UV or local heating. A suitable material is FP4451TD from Henkel Loctite Corp.

An alternate method of forming the dam is to make a "widow frame" from a suitable material with the desired "window" shape. The shape might be square, rectangular, round, oval, etc. as desired in the end product. In this case, the window may be molded or otherwise formed separately and placed around the parts to be encapsulated.

The important properties of the dam material 95 are: i) that it seal adequately to the sticky surface to prevent encapsulant 96 applied in step 4, from going under it, lifting it or moving it, ii) allows the encapsulant applied in step 4 to stick to it adequately to form a good bond, iii) has properties compatible with the end use of the unit, and iv) forms a complete dam to contain the encapsulant 96.

Step 4 is the dispensing of the encapsulant 96 inside of the dammed area or areas. Again, this can be done using a Camelot and needle system or any other method that allows adequate control of the quantity of encapsulant material dispensed and control of its height with respect to the dam and components, 6.1, 6.2 and 11, to be encapsulated.

Step 5 is removal of the placement fixture 1 as described earlier.

Step 6 is inverting the assembly 97 and placing it on the Support Fixture 98.

Step 7 is formation of the interconnect structure 99 utilizing methods as described above.

Step 8 is placement of the interconnect side parts 17 as described above.

Step 9 is the application of an overcoat 100 if needed, to a suitable thickness to protect the interconnect structure.

Step 10 is removal of the support fixture 98.

Step 11 is saw singulating the assembly by cutting through the encapsulant forming kerf 101 to make parts 102.

In some cases, it may be desirable to reverse the order of steps 10 and 11 and remove the units 102 from the support fixture 98 only after they are singulated.

If a "window frame" was used to form the dam 95 singulation may be more complex, especially if the window frames are not square or rectangular. Saw singulation may not be possible if some cuts are not straight lines. In the case or irregular shapes, laser singulation to form kerf 101 may suitably be utilized. A high intensity narrow laser beam can form the kerf by removing material utilizing either a thermal process (CO2 laser and infrared photons) or an ablation process (UV photons). The beam must be steered and move at a rate compatible with its power so as to remove all of the material necessary. A laser beam has the advantage that its direction can be programmed to any pattern desired and thus cut any shape needed.

FIG. 21 illustrates a further embodiment of the invention that allows electrical contacts, electrical connectors or other parts or components that need to avoid encapsulation to protrude from the side of a finished unit. This embodiment utilizes the "dam" containment means concept described in FIG. 20 but with a further refinement.

Step 1 shows a modified placement fixture 105 suitable for use with this embodiment. This fixture has clearances 103 at suitable locations. It also breaks the sticky surface 104 into sections to accommodate the clearances 103.

Step 2 shows the placement of parts on the sticky surface. Among these are 6.1, 6.2 and 11 similar to the parts described and placed earlier. Part 106 however, is placed in a different type of location 107. This location is suitable for parts 106 that may be a connector, a contact, or some other component where full encapsulation is not desirable for some reason.

Step 3 shows dispensing a dam 108 over the component 107 in a manner that seals around the part so encapsulant 110 applied in step 4, will not leak. The dam at point 109 is similar to that of FIG. 20.

Step 4 shows dispensing of the encapsulant 110 into the enclosed spaces formed by the dams 108 and 109.

Step 5 shows the inversion of the assembly 111 with the encapsulation fixture 105 still in position and placement of the combination onto support fixture 112.

Step 6 shows removal of the placement fixture 105 as described earlier.

Step 7 shows formation of the interconnect 113 utilizing one of the methods described earlier that is suitable, such as e.g., needle dispensing if parts protrude above the surface on which the interconnect is deposited, screen printing if the surface is relatively flat, etc.

Step 8 shows placement of the interconnect side parts 114 as described earlier.

Step 9 shows application of the overcoat 115 as described earlier.

Step 10 shows the units 116 removed from the support fixture and ready for subsequent processing if desired. Item 117, which may be a connector pin, for example, is now accessible and free from encapsulation.

Those skilled in the art will understand how to use various combinations of the methods and fixtures previously described to achieve the desired combination of features in the final unit being fabricated.

Alternatives (and in some cases the specific Figures illustrating same) include:

| Choice | Options |
| --- | --- |
| 1. Placement fixture | A sticky layer with or without a layout, FIG. 2 |
| | A sticky layer on a release layer with or without a layout, FIG. 9 |
| | A discontinuous sticky surface to accommodate parts that protrude below the sticky surface |
| | A layout transparency under the sticky surface and release layer on the rigid base on the bottom of a transparent rigid base. |
| 2. Placement | Parts placed on one side |
| | Parts placed on two sides |
| | Place holders for sensitive parts to be placed later |
| | Placement of surface mount type components, such as an electrical contact, that has a contact on the sticky surface but that also protrude above the encapsulant to allow electrical connection of the finished part. |
| | Placement of components that should not be encapsulated so that they can be "damned" off from the encapsulant flow with a deposited dam. |

| Choice | Options |
|---|---|
| 3. Containment means (fixture or containment dam) | Window frame, FIG. 5<br>Cavity frame, FIG. 6<br>Fixtures on two sides, FIGS. 14 and 15<br>Fixtures forming a final shape, FIG. 17<br>Fixture with pedestals forming cavities for sensitive parts FIG. 18<br>Fixture with pedestal to form holes, FIG. 19<br>Step where the containment fixture is removed<br>Dam of a suitable material deposited with a needle dispenser<br>Dam of a suitable material deposited using an alternative method<br>Dam made from a "window frame" placed on the sticky surface<br>Dam made from a "window frame" that will be integral with the final unit placed on the sticky surface<br>Dam used to block off encapsulant and exclude flow. |
| 4. Encapsulant | Single side, single layer, FIG. 1<br>Single side dual layer, FIG. 7<br>Double sided, single layer, e.g., FIGS. 14 & 15.<br>Double sided, double layer first side, single layer second side<br>A different encapsulant used for each layer<br>Part encapsulation formed from the combination of a dam and encapsulant deposited within the dam.<br>Encapsulant put in position utilizing transfer or injection molding |
| 5. Interconnect & Dielectric Structure | One layer of interconnect and no dielectric overcoat<br>One layer of interconnect with a protective dielectric overcoat<br>Two or more layers of interconnect and dielectric |
| 6. Interconnect and dielectric deposition | Screen printing<br>Stamp printing<br>Needle dispense<br>Electroplating with an additive process (a standard process used to fabricate printed circuit boards and is well known in the industry).<br>Ink jet dispense<br>Application of a series of decals |
| 7. Interconnect & dielectric structure protection | None, with the dielectric and/or interconnect exposed, FIG. 13<br>Overcoating the structure with a thin protective coat, FIG. 14<br>Encapsulate the interconnect structure, FIGS. 14, 15 |
| 8. Support fixture | Where appropriate for parts that protrude above the encapsulation or for parts that protrude above the containment fixture<br>If needed to handle parts during singulation |
| 9. Singulation | Sawing, FIG. 1<br>Using a containment fixture with cavities, e.g., FIG. 5.<br>Using two matching containment fixtures, e.g., FIGS. 14, 15.<br>Using window dams that require no singulation<br>Using laser singulation to cut arbitrary shapes. |

Of the above possible process combinations, those combinations of process steps which are most preferred are:

| | |
|---|---|
| 1. Placement fixture | A sticky layer on a release layer with or without a layout, FIG. 9<br>A layout transparency on the bottom of a transparent rigid base. |
| 2. Placement | Parts placed on two sides |
| 3. Containment fixture | Fixtures on two sides, FIGS. 14 and 15<br>Fixtures forming a final shape, FIG. 17<br>Fixture with pedestals to form cavities for sensitive parts, FIG. 18<br>Fixture with pedestal to form holes, FIG. 19 |
| 4. Encapsulant | Single side dual layer, FIG. 7<br>Double sided, double layer first side, single layer second side<br>A different encapsulant used for each layer |
| 5. Interconnect & Dielectric Structure | One layer of interconnect and no dielectric overcoat<br>One layer of interconnect with a protective dielectric overcoat<br>Two, or more, layers of interconnect and/or dielectric |
| 6. Interconnect and dielectric deposition | Screen printing<br>Needle dispense<br>Electroplating with an additive process |
| 7. Interconnect & dielectric structure protection | Encapsulate the interconnect structure, FIG. 14, 15 |
| 8. Support fixture | If appropriate for parts that protrude above the encapsulation<br>If appropriate for parts that protrude above the containment fixture |
| 9. Singulation | Using two matching containment fixtures, e.g., FIGS. 14, 15, etc.<br>Using one containment fixture.<br>Saw Singulation<br>Laser singulation |

Those skilled in the art will be able to select an appropriate combination from the identified alternatives to achieve their objectives for any specific combination of components.

Although the invention has been described with reference to specific exemplary embodiments thereof, it will be evident that various modifications and changes may be made thereto without departing from the broader spirit and scope of the invention. The specification and drawings are, accordingly, to be regarded in an illustrative rather than a restrictive sense.

What is claimed is:

1. An electronic component assembly fabricated in accordance with a process comprising the steps of:
   i) providing a placement fixture comprising a rigid planar base having a sticky coating on one surface thereof,
   ii) placing a plurality of electronic components at least some of which include electric contacts, on said sticky coating in a desired pattern,
   iii) placing a containment means on said sticky coating, said containment means enclosing the components,
   iv) dispensing sufficient encapsulant into the containment means to thereby partially encapsulate the components,
   v) separating at least the placement fixture from the encapsulated components to thereby expose the electrical contacts of the components, all said contacts being in a single plane,
   vi) interconnecting the electrical contacts of the components wherein said interconnection is achieved in a plurality of steps comprising: a) applying a first planar interconnect layer to the component contacts; b) applying a dielectric layer containing vias over said first interconnect layer; c) applying an additional planar interconnect layer which connects to said first interconnect layer through said vias, and
   vii) placing additional components in electrical contact with the components interconnected in step vi).

2. An electronic component assembly fabricated in accordance with a process comprising the steps of:
   i) providing a placement fixture comprising a rigid planar base having a sticky coating on one surface thereof,
   ii) placing a plurality of electronic components at least some of which include electric contacts on said sticky coating in a desired pattern,
   iii) placing a containment means on said sticky coating, said containment means enclosing the components,
   iv) dispensing a first quantity of encapsulant in an amount which will not cause the placed components to lift off the sticky coating but which is sufficient on solidification to maintain the components in position,
   v) dispensing a second quantity of encapsulant sufficient to provide structural integrity to the placed components,
   vi) separating at least the placement fixture from the encapsulated components to thereby expose the electrical contacts of the components, all said contacts being in a single plane,
   vii) interconnecting the electrical contacts of the components to thereby provide a planar interconnect structure, which is achieved in a plurality of steps comprising:
      a) applying a first planar interconnect layer over the components;
      b) applying a dielectric layer containing vias over said first interconnect layer;
      c) applying an additional planar interconnect layer which connects to said first interconnect layer through said vias, and
   viii) connecting additional components to the structure formed in step vii), and encapsulating said additional components.

3. An electronic component assembly fabricated in accordance with a process comprising the steps of:
   i) providing a placement fixture comprising a rigid planar base having a sticky coating on one surface thereof,
   ii) placing a plurality of electronic components at least some of which include electric contacts, on said sticky coating in a desired pattern,
   iii) placing a containment means on said sticky coating, said containment means enclosing the components,
   iv) dispensing sufficient encapsulant into the containment means to thereby fully encapsulate the components,
   v) separating the placement fixture from the encapsulated components to thereby expose the electrical contacts of the components, all said contacts being in a single plane,
   vi) interconnecting the electrical contacts of the components wherein said interconnection is achieved in a plurality of steps comprising: a) applying a first planar interconnect layer over the components; b) applying a dielectric layer containing vias over said first interconnect layer; c) applying an additional planar interconnect layer which connects to said first interconnect layer through said vias, and
   vii) placing additional components in electrical contact with the components interconnected in step vi).

4. An electronic component assembly fabricated in accordance with a process comprising the steps of:
   i) providing a placement fixture comprising a rigid planar base having a sticky coating on one surface thereof,
   ii) placing a plurality of electronic components at least some of which include electric contacts, on said sticky coating in a desired pattern,
   iii) placing a containment means on said sticky coating, said containment means enclosing the components,
   iv) dispensing sufficient encapsulant into the containment means to thereby partially encapsulate the components,
   v) separating the placement fixture from the encapsulated components to thereby expose the electrical contacts of the components, all said contacts being in a single plane,
   vi) interconnecting the electrical contacts of the components wherein said interconnection is achieved in a plurality of steps comprising:
      a) applying a first planar interconnect layer over the components;
      b) applying a dielectric layer containing vias over said first interconnect layer; and
      c) applying an additional planar interconnect layer which connects to said first interconnect layer through said vias.

5. An electronic component assembly fabricated in accordance with a process comprising the steps of:
   i) providing a placement fixture comprising a rigid planar base having a sticky coating on one surface thereof,
   ii) placing a plurality of electronic components at least some of which include electric contacts on said sticky coating in a desired pattern,
   iii) placing a containment means on said sticky coating, said containment means enclosing the components,
   iv) dispensing a first quantity of encapsulant in an amount which will not cause the placed components to lift off the sticky coating but which is sufficient on solidification to maintain the components in position,
   v) dispensing a second quantity of encapsulant sufficient to provide structural integrity to the placed components,
   vi) separating the placement fixture from the encapsulated components to thereby expose the electrical contacts of the components, all said contacts being in a single plane, vii) interconnecting the electrical contacts of the components to thereby provide a planar interconnected structure, which is achieved in a plurality of steps comprising:
  a) applying a first planar interconnect layer over the components;
  b) applying a dielectric layer containing vias over said first interconnect layer; and
  c) applying an additional planar interconnect layer which connects to said first interconnect layer through said vias.

6. An electronic component assembly fabricated in accordance with a process comprising the steps of:
  i) providing a placement fixture comprising a rigid planar base having a sticky coating on one surface thereof,
  ii) placing a plurality of electronic components at least some of which include electric contacts, on said sticky coating in a desired pattern,
  iii) placing a containment means on said sticky coating, said containment means enclosing the components,
  iv) dispensing sufficient encapsulant into the containment means to thereby fully encapsulate the components,
  v) separating the placement fixture from the encapsulated components to thereby expose the electrical contacts of the components all said contacts being in a single plane,
  vi) interconnecting the electrical contacts of the components wherein said interconnection is achieved in a plurality of steps comprising:
    a) applying a first planar interconnect layer over the components;
    b) applying a dielectric layer containing vias over said first interconnect layer;
    c) applying an additional planar interconnect layer which connects to said first interconnect layer through said vias.

7. The electronic component assembly of claim 1, wherein said placement fixture further comprises a layer of release material interposed between said rigid base and said sticky coating.

8. The electronic component assembly of claim 2, wherein said placement fixture further comprises a layer of release material interposed between said rigid base and said sticky coating.

9. The electronic component assembly of claim 3, wherein said placement fixture further comprises a layer of release material interposed between said rigid base and said sticky coating.

10. The electronic component assembly of claim 4, wherein said placement fixture further comprises a layer of release material interposed between said rigid base and said sticky coating.

11. The electronic component assembly of claim 5, wherein said placement fixture further comprises a layer of release material interposed between said rigid base and said sticky coating.

12. The electronic component assembly of claim 6, wherein said placement fixture further comprises a layer of release material interposed between said rigid base and said sticky coating.

* * * * *